(12) United States Patent
Miki et al.

(10) Patent No.: US 7,485,935 B2
(45) Date of Patent: Feb. 3, 2009

(54) SEMICONDUCTOR MEMORY DEVICE

(75) Inventors: Takashi Miki, Hyogo (JP); Yasuo Murakuki, Kyoto (JP)

(73) Assignee: Panasonic Corporation, Osaka (JP)

( * ) Notice: Subject to any disclaimer, the term of this patent is extended or adjusted under 35 U.S.C. 154(b) by 101 days.

(21) Appl. No.: 11/790,009

(22) Filed: Apr. 23, 2007

(65) Prior Publication Data
US 2007/0247889 A1    Oct. 25, 2007

(30) Foreign Application Priority Data
Apr. 25, 2006    (JP) .............................. 2006-121349

(51) Int. Cl.
*H01L 27/088* (2006.01)
(52) U.S. Cl. .................. 257/390; 257/295; 257/751
(58) Field of Classification Search ................. 257/390, 257/295, 751
See application file for complete search history.

(56) References Cited

FOREIGN PATENT DOCUMENTS

| | | |
|---|---|---|
| EP | 1 056 128 | 11/2000 |
| EP | 1 204 142 | 5/2002 |
| JP | 10-162587 | 6/1998 |
| JP | 2001-44376 | 2/2001 |
| JP | 2002-198494 | 7/2002 |

*Primary Examiner*—Douglas M Menz
(74) *Attorney, Agent, or Firm*—Wenderoth, Lind & Ponack, L.L.P.

(57) ABSTRACT

A semiconductor memory device is provided with plural memory cells, plural bit lines BL, each bit line being commonly connected to the plural memory cells that are arranged in the same row, plural word lines WL and plural plate lines CP, each word line and each plate line being commonly connected to the plural memory cells that are arranged in the same column, plural plate voltage supply lines CPS arranged in the column direction, and means for electrically connecting each of the plural plate voltage supply lines to each of the corresponding plural plate lines. The plate voltage supply lines are composed of a material having a resistance lower than that of the plate lines, each of capacitors of the plural memory cells is covered with a hydrogen barrier film HB at its periphery, the plural plate voltage supply lines are disposed beneath the hydrogen barrier film HB, and the plural plate voltage supply lines CPS are, when viewed in a plane, electrically connected to the same plate line at plural positions of the same plate line, within a region where the hydrogen barrier film is disposed.

12 Claims, 23 Drawing Sheets

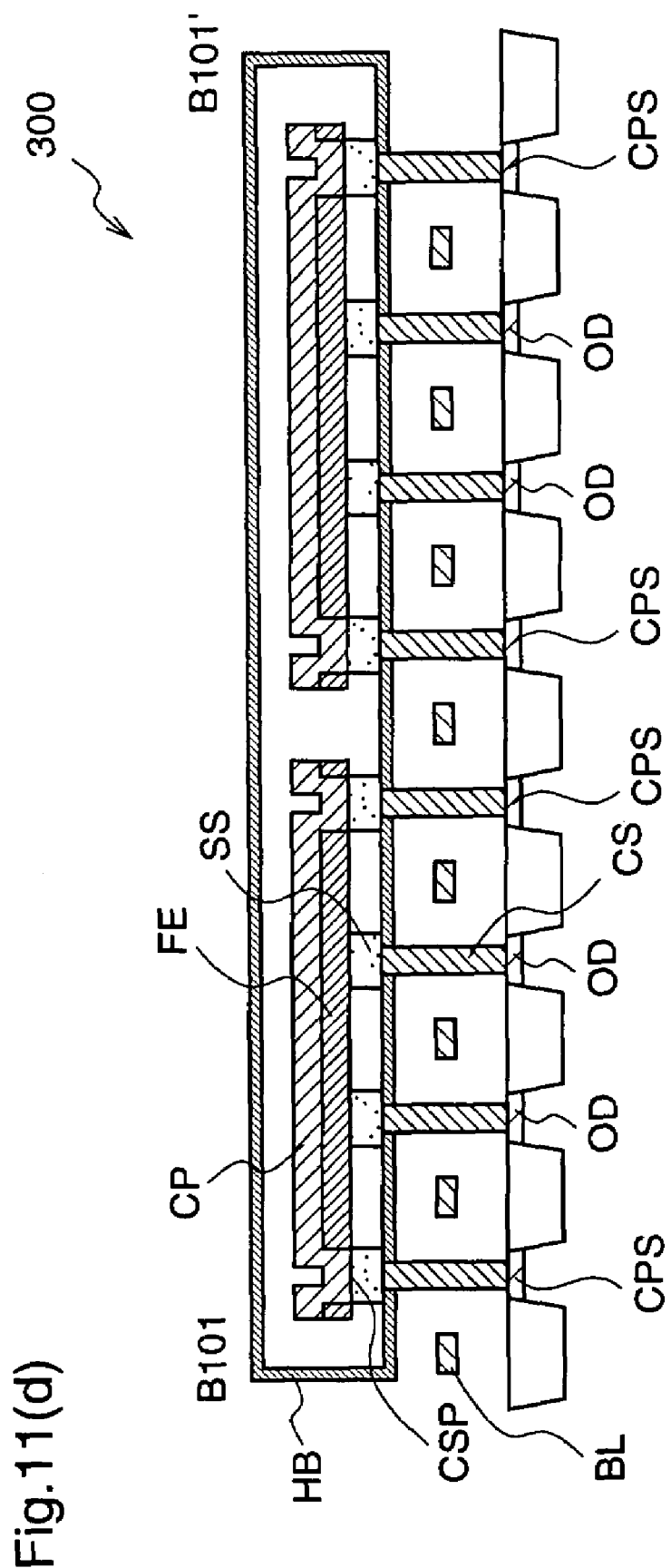

SEMICONDUCTOR MEMORY DEVICE

FIELD OF THE INVENTION

The present invention relates to a semiconductor memory device, and more particularly, to a layout technique for a semiconductor memory device equipped with a ferroelectric layer.

BACKGROUND OF THE INVENTION

In recent years, there has been known a semiconductor memory device which makes data storage nonvolatile by using a ferroelectric film as an insulating film for a capacitor. Transition of polarized state of a ferroelectric layer shows hysteresis characteristics, and remnant polarization exists in the ferroelectric layer even when a voltage applied to the ferroelectric layer becomes 0. Storage of nonvolatile data is performed utilizing the remnant polarization.

In order to read the nonvolatile data from the ferroelectric capacitor, it is necessary to apply a voltage to the ferroelectric capacitor, and generally, reading is carried out by driving a plate line that constitutes an electrode of the ferroelectric capacitor.

While the plate line usually drives plural memory cells that are arranged in a word line direction, the capacitance of the ferroelectric capacitor that is driven by the plate line is significantly larger than the capacitance of a capacitor that is made of a silicon oxide film and is usually adopted in a dynamic semiconductor memory device, and therefore, the load capacitance connected to the plate line becomes excessively large. Further, Ir or IrO is used as a constituent material of the plate line, and the resistances of these materials are high.

The excessive increase in the load capacitance connected to the plate line and the high resistance of the plate line lead to a problem that the access time of the memory device is significantly increased.

On the other hand, in order to drive the plate line at an appropriate speed, a MOS transistor of high driving ability must be used, leading to increased power consumption and enlarged layout area.

So, a circuit system and a circuit operation, such as a plate line voltage fixing system, have been proposed as a method for resolving the above-mentioned problems, i.e., the excessive increase in the load capacitance of the plate line and the increase in the layout area.

Hereinafter, a description will be given of a semiconductor memory equipped with a ferroelectric layer, as a first prior art that proposes a measure for solving the above-mentioned problems.

The first prior art discloses a semiconductor circuit that is operated in a state where a plate line is not driven and the voltage of the plate line is fixed, on the premise that the plate line driving system cannot avoid the above-mentioned problem (for example, refer to Japanese Published Patent Application No. Hei. 10-162587 (Patent Document 1)). According to this system, since the plate line is not driven, the plate line driving time is omitted to prevent an increase in access time.

By the way, it has conventionally been well known that the semiconductor memory device equipped with a ferroelectric layer has a problem that the ferroelectric capacitor characteristic is degraded by a reduction due to hydrogen which occurs during manufacturing processes.

So, as a method for preventing such degradation in the ferroelectric capacitor characteristic due to hydrogen, which is the problem of the first prior art, a technique of covering the periphery of the ferroelectric capacitor with a hydrogen barrier film has been proposed.

Hereinafter, a description will be given of a semiconductor memory device equipped with a ferroelectric layer according to second and third prior arts that propose a measure for solving the above-mentioned problem.

The second and third prior arts adopt a technique of enclosing a ferroelectric capacitor with a hydrogen barrier film, and disclose a construction in which electrical contact is made from beneath an upper electrode (for example, refer to Japanese Published Patent Application No. 2002-198494 (Patent Document 2), and Japanese Published Patent Application No. 2001-44376 (Patent Document 3)). According to this method, diffusion of hydrogen to the capacitor is prevented to prevent reduction of the capacitor due to hydrogen, thereby avoiding deterioration in the capacitor characteristic.

In the first to third prior arts, however, it is highly possible that the following drawbacks occur.

First of all, in the first prior art, a layout as shown in FIG. 4 is usually considered. Since the first prior art that is disclosed in the Patent Document 1 does not particularly specify a layout, FIG. 4 presumptively shows a generally considered layout.

FIG. 4 is a plan view of a semiconductor memory device 110 that is considered as a layout relating to the first prior art. In the semiconductor memory device, word lines WL extending in a column direction (DWL direction) are disposed, bit lines BL extending in a row direction (DBL direction) are disposed, a plate line CP as large as a memory cell array MA is disposed, sense amplifier circuits SA are adjacently disposed in the row direction (DBL direction) of the memory cell array MA, plate line voltage supply circuit CPD are adjacently disposed in the column direction (DWL direction) of the memory cell array MA, the bit lines BL are connected to the sense amplifier circuits SA, and the plate line CP is connected to the plate line voltage supply circuits CPD.

While this semiconductor memory device adopts an operation system with voltage of the plate line CP being fixed, usually supply of voltage to the plate line is performed at ends of the memory cell array MA.

However, the following problem has become evident by an analysis performed by the inventors. That is, in the case where supply of voltage to the plate line is performed at only the periphery of the memory cell array MA, since the resistance of the plate line is high in a nonoperating memory cell that is disposed in the vicinity of a specific memory cell that is operating, the voltage of the plate line is likely to occur temporal and local undershoot or overshoot, leading to degradation in data holding of the memory cell.

For example, when a memory cell at Pos1 shown in FIG. 4 is operated, the plate line voltage in the vicinity of the Pos1 varies.

At this time, although the plate line voltage in the vicinity of a nonoperating memory cell at Pos2 is supplied from the periphery of the memory cell array, insufficient voltage supply occurs because the resistance of the plate line is high, and thereby the plate line voltage in the vicinity of the Pos2 also varies with the variation in the plate line voltage in the vicinity of the Pos1.

As a result, an abbreviated writing operation of the memory cell in the vicinity of the Pos2 is undesirably carried out, leading to degradation in data holding of the memory cell.

Further, in order to solve this problem, the memory cell array MA may be constituted by plural small-scale memory cell arrays, and plural plate lines each having a size as large as each of the small-scale memory cells may be disposed for the respective memory cell arrays. In this case, however, it is necessary to provide plural plate line voltage generation circuit CPD, leading to an increase in the area of the semiconductor device.

Next, as for the second and third prior arts, layouts as shown in FIGS. 1 to 3 are usually considered. Since the second and third prior arts disclosed in the Patent Documents 2 and 3 do not particularly specify layouts, FIGS. 1 to 3 presumptively show generally considered layouts.

FIG. 1 is a plan view of a semiconductor memory device 210 that is conceivable as a first layout relating to the second-hand third prior arts. In the semiconductor memory device 210, plate lines CP and word lines WL, which extend in the column direction (DWL direction), are disposed, bit lines BL extending in the row direction (DBL direction) is disposed, and the memory cell MC is enclosed with a hydrogen barrier film.

FIG. 2 is a plan view of a semiconductor memory device 220 that is conceivable as a second layout relating to the second and third prior arts. In the semiconductor memory device 220, plate lines CP extending in the column direction (DWL direction) are connected to backing lines CPU for the plate lines CP in regions between plural hydrogen barrier films HB, where no hydrogen barrier films HB exist.

FIG. 3 is a cross-sectional view of the semiconductor memory device 220 that is conceivable as the second layout relating to the second and third prior arts, and it is taken along a line B1-B1' in FIG. 2. The semiconductor memory device 220 has plate lines CP extending in the column direction (DWL direction), and each memory cell MC is enclosed with a hydrogen barrier film HB. The plate lines CP are connected to the backing lines CPU for the plate lines CP in regions between the plural hydrogen barrier films HB.

In this method, although the resistance of the plate lines CP reaches an unignorable level as miniaturization and high-integration of the semiconductor memory device are advanced, the backing lines CPU having a resistance lower than that of the plate lines CP are disposed above the hydrogen barrier film HB, and the lower plate lines CP and the upper backing lines CPU are connected, thereby to achieve speed-up.

However, in order to provide regions where the backing lines CPU and the plate lines CP are connected, it is necessary to provide regions where no hydrogen barrier film HB exists, leading to an increase in the area of the ferroelectric memory device.

SUMMARY OF THE INVENTION

The present invention is made to solve the above-described problems and has for its object to provide a semiconductor memory device equipped with a ferroelectric layer, which realizes high-speed operation, reduced area, and low power consumption, by contriving a layout of voltage supply to plate lines.

Other objects and advantages of the invention will become apparent from the detailed description that follows. The detailed description and specific embodiments described are provided only for illustration since various additions and modifications within the scope of the invention will be apparent to those of skill in the art from the detailed description.

In order to solve the above-mentioned problems, a semiconductor memory device according to the present invention is provided with plate voltage supply lines for supplying voltage to plate lines that are arranged in the same direction as word lines, and the plate voltage supply lines are disposed beneath a hydrogen barrier film, in the same direction as the plate lines.

To be specific, the semiconductor memory device according to the present invention comprises plural memory cells which are formed on a substrate and arranged in a matrix pattern, each memory cell having a capacitor; plural bit lines, each bit line being commonly connected to the plural memory cells that are arranged in the same row; plural word lines and plural plate lines, each word line and each plate line being commonly connected to the plural memory cells that are arranged in the same column; plural plate voltage supply lines arranged in the column direction; and means for electrically connecting each of the plural plate voltage supply lines to each of the corresponding plural plate lines; wherein the plate voltage supply lines are composed of a material having a resistance lower than that of the plate lines; each of the plural capacitors is covered with a hydrogen barrier film at its periphery; the plural plate voltage supply lines are disposed beneath the hydrogen barrier film; and the plural plate voltage supply lines are, when viewed in a plane, electrically connected to the same plate line at plural positions of the same plate line, within a region where the hydrogen barrier film is disposed.

In this construction, since voltage to the plate line can be supplied from the plural positions in the plate line voltage supply line having a resistance lower than that of the plate line, delay in plate line drive is prevented, thereby realizing stable plate line voltage, and high-speed plate line drive.

Further, since the plate voltage supply lines are disposed beneath the hydrogen barrier film, the plate lines and the plate voltage supply lines can be connected in the region where the hydrogen barrier film exists, without separating the hydrogen barrier film, leading to a reduction in the area of the memory cell array.

Further, in the semiconductor memory device according to the present invention, it is preferable that each of the plural plate lines also serves as an upper electrode of the capacitor that is included in each of the plural memory cells arranged in the same column.

In this construction, since the plate lines can be formed without the necessity of newly providing a wiring layer, the semiconductor memory device can be easily fabricated with no increase in process steps.

Further, in the semiconductor memory device according to the present invention, it is preferable that the plural plate voltage supply lines are composed of a diffused layer that is formed in the substrate.

Further, in the semiconductor memory device according to the present invention, it is preferable that the plural plate voltage supply lines are formed of the same layer as the word lines.

In the above-mentioned construction, since the plate voltage supply lines can be fabricated without the necessity of newly providing a wiring layer, the semiconductor memory device can be easily fabricated with no increase in process steps.

Further, in the semiconductor memory device according to the present invention, it is preferable that the plural memory cells covered with the single hydrogen barrier film are divided into at least two memory cell groups in the column direction, and the memory cells that are arranged in the same column and are included in different memory cell groups are connected to different plate lines.

In this construction, since the plate line corresponding to one word line is divided, the load capacities of one plate line and one plate voltage supply line can be reduced, whereby delay in driving the plate line and the plate voltage supply line is further prevented, the plate line voltage is further stabilized, and the speed of driving the plate line and the plate voltage supply line is further increased, and moreover, the area of the circuit that supplies voltage to the plate lines can be further reduced.

Further, in the semiconductor memory device according to the present invention, it is preferable that the plate lines are selectively operated by the means that electrically connects the plate lines and the plate voltage supply lines.

In this construction, since voltage supply to the plate lines is performed by the selected plate line voltage supply lines, reduction in power consumption can be achieved.

Further, voltage is supplied to the plate voltage supply lines before starting operation, and the voltage is given to the plate lines by the connection means when operation is started, whereby the path for transmitting the voltage is shortened, and supply of voltage to the plate lines is speedily carried out, resulting in further speed-up.

Further, in the semiconductor memory device according to the present invention, it is preferable that the means that electrically connects the plate lines and the plate voltage supply lines is a selection circuit including at least one transistor.

In this construction, since a required number of plate lines among the plural plate lines can be selectively driven by the single plate voltage supply line, reduction in area and reduction in power consumption can be achieved.

Further, in the semiconductor memory device according to the present invention, it is preferable that a gate of at least one transistor among the transistors included in the selection circuit is connected to the word lines.

In this construction, since the plate lines can be driven in synchronization with the word lines, the circuit structure and the operation system can be facilitated. Further, since the word lines and the gates of the transistors can be constituted by a common wiring, further reduction in the area of the memory cell can be achieved.

Further, in the semiconductor memory device according to the present invention, it is preferable that the means that electrically connects the plate lines and the plate voltage supply lines is constituted by using at least one of a wiring and a contact plug, and the plate line and the plate voltage supply lines are directly electrically connected.

In this construction, it is possible to easily obtain an operation system with the voltage of the plate lines being fixed.

Particularly, in the conventional semiconductor memory device, voltage is supplied to the plate lines at only the periphery of the memory cell array, the resistance of the plate lines is high in the memory cells that are disposed around the operating memory cell during operation, and thereby the voltage of the plate lines is likely to cause local undershoot or overshoot, resulting in deterioration in data holding of the memory cells. However, in the construction of the present invention, since voltage can be supplied to the plate lines at plural positions both in the row direction and the column direction, the voltage of the plate lines can be further stabilized.

Further, in the semiconductor memory device according to the present invention, it is preferable that the plate voltage supply lines are power supply lines.

In this construction, a new voltage generation circuit is not required because a power supply wiring is used as the plate voltage supply lines, leading to a reduction in the area of the memory circuit.

Further, since the power supply wiring has a sufficient voltage supply capability, the voltages of the plate voltage supply lines and the plate lines can be stabilized.

Further, in the semiconductor memory device according to the present invention, it is preferable that the capacitor is a ferroelectric capacitor or a high dielectric capacitor.

Further, a semiconductor memory device according to the present invention comprises plural memory cells which are formed on a substrate and arranged in a matrix pattern, each memory cell having a capacitor; plural bit lines, each bit line being commonly connected to the plural memory cells that are arranged in the same row; plural word lines, each word line being commonly connected to the plural memory cells that are arranged in the same column; a plate line provided commonly to the plural word lines; plural plate voltage supply lines arranged in the column direction; and means for electrically connecting the plural plate voltage supply lines to the plate line; wherein the plate voltage supply lines are composed of a material having a resistance lower than that of the plate line; each of the plural capacitors is covered with a hydrogen barrier film at its periphery; the plural plate voltage supply lines are disposed beneath the hydrogen barrier film; and the plural plate voltage supply lines are, when viewed in a plane, electrically connected to the same plate line at plural positions of the same plate line, within a region where the hydrogen barrier film is disposed.

In this construction, since supply of voltage to the plate line is performed not at an edge of the memory cell array but voltage is supplied to one plate line at plural positions in both the row direction and the column direction, the voltage of the plate lines can be further stabilized especially in the center of the plate lines, as compared with the conventional technique.

EFFECTS OF THE INVENTION

As described above, the semiconductor memory device of the present invention is provided with the plate voltage supply lines for supplying voltage to the plate lines that are arranged in the same direction as the word lines, and the plate voltage supply lines are disposed beneath the hydrogen barrier film, in the same direction as the plate lines, thereby realizing a reduced-area semiconductor memory device capable of high-speed driving of the plate lines.

BRIEF DESCRIPTION OF THE DRAWINGS

FIG. 9(*b*) is a A102-A102' cross-sectional view of the semiconductor memory device 100 shown in FIG. 9(*a*).

FIG. 9(*c*) is a A101-A101' cross-sectional view of the semiconductor memory device 100 shown in FIG. 9(*a*).

FIG. 9(*d*) is a B101-B101' cross-sectional view of the semiconductor memory device 100 shown in FIG. 9(*a*).

FIG. 9(*e*) is a schematic circuit diagram of the semiconductor memory device 100 shown in FIG. 9(*a*).

FIG. 10(*b*) is a A102-A102' cross-sectional view of the semiconductor memory device 200 shown in FIG. 10(*a*).

FIG. 10(*c*) is a A101-A101' cross-sectional view of the semiconductor memory device 200 shown in FIG. 10(*a*).

FIG. 10(*d*) is a B101-B101' cross-sectional view of the semiconductor memory device 200 shown in FIG. 10(*a*).

FIG. 10(*e*) is a schematic circuit diagram of the semiconductor memory device 200 shown in FIG. 10(*a*).

FIG. 11(*b*) is a A102-A102' cross-sectional view of the semiconductor memory device 300 shown in FIG. 11(*a*).

FIG. 11(*c*) is a A101-A101' cross-sectional view of the semiconductor memory device 300 shown in FIG. 11(*a*).

FIG. 11(*d*) is a B101-B101' cross-sectional view of the semiconductor memory device 300 shown in FIG. 11(*a*).

FIG. 11(*e*) is a schematic circuit diagram of the semiconductor memory device 300 shown in FIG. 11(*a*).

FIG. 12(*b*) is a A102-A102' cross-sectional view of the semiconductor memory device 400 shown in FIG. 12(*a*).

FIG. 12(*c*) is a A101-A101' cross-sectional view of the semiconductor memory device 400 shown in FIG. 12(*a*).

FIG. 12(*d*) is a B101-B101' cross-sectional view of the semiconductor memory device 400 shown in FIG. 12(*a*).

FIG. 12(*e*) is a schematic circuit diagram of the semiconductor memory device 400 shown in FIG. 12(*a*).

DETAILED DESCRIPTION OF THE PREFERRED EMBODIMENTS

Embodiment 1

Hereinafter, a semiconductor memory device according to a first embodiment of the present invention will be described with reference to FIGS. 5 and 9(*a*)-9(*e*).

Figure 1:
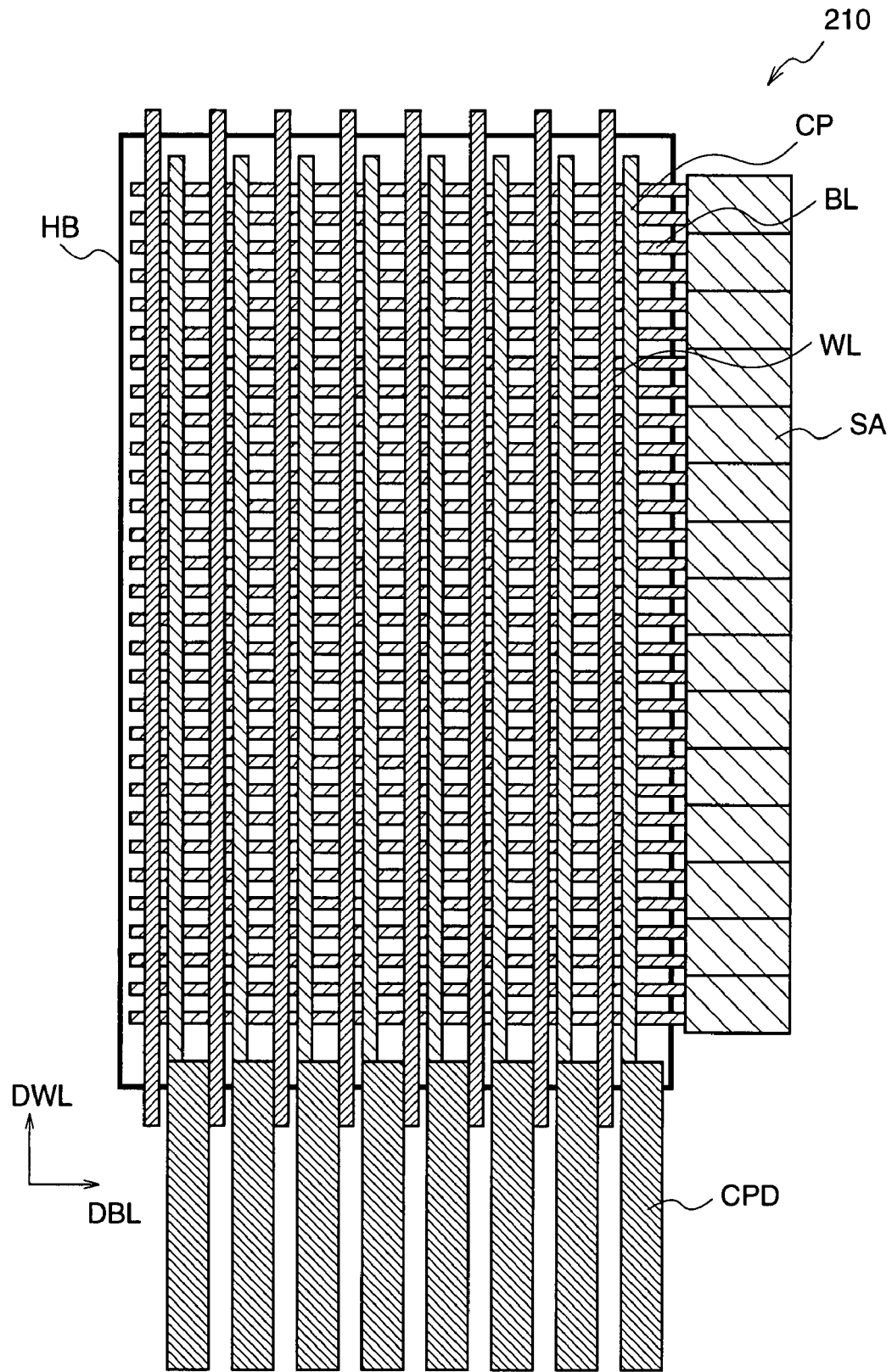
FIG. 1 is a plan view of a semiconductor memory device 210 having a first layout, according to the second and third prior arts.
Figure 2:
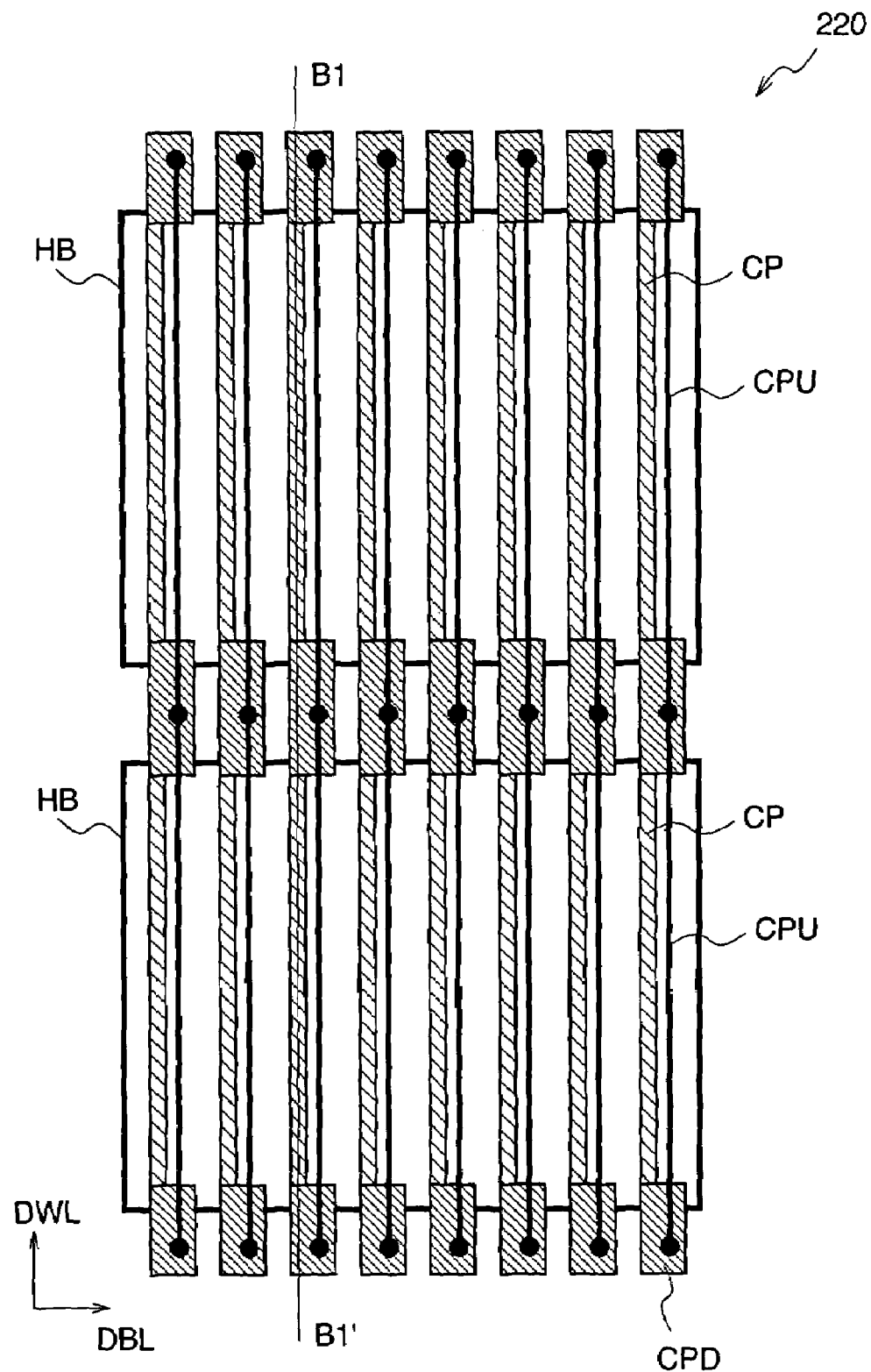
FIG. 2 is a plan view of a semiconductor memory device 220 having a second layout, according to the second and third prior arts.
Figure 3:
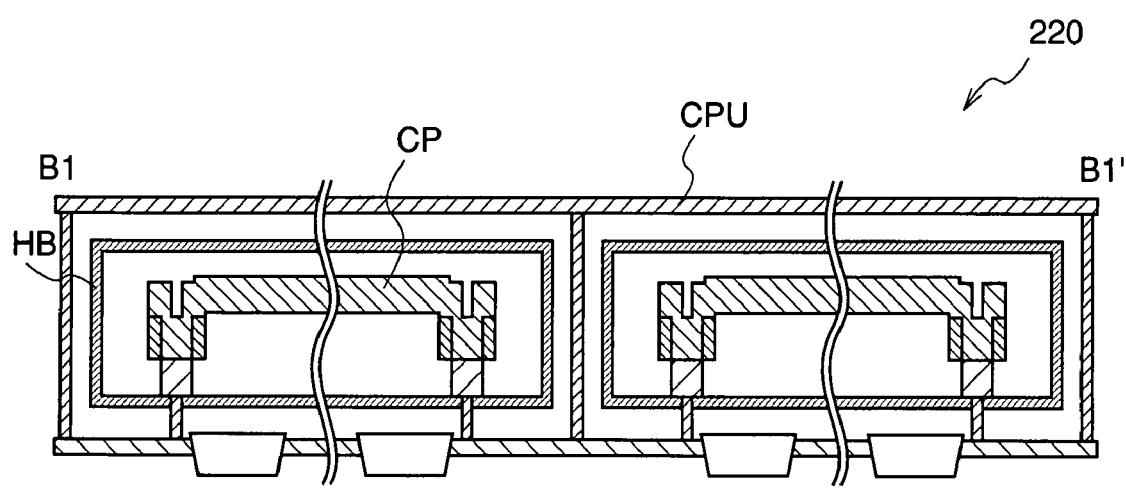
FIG. 3 is a cross-sectional view of the semiconductor memory device 220 having the second layout, according to the second and third prior arts.
Figure 4:
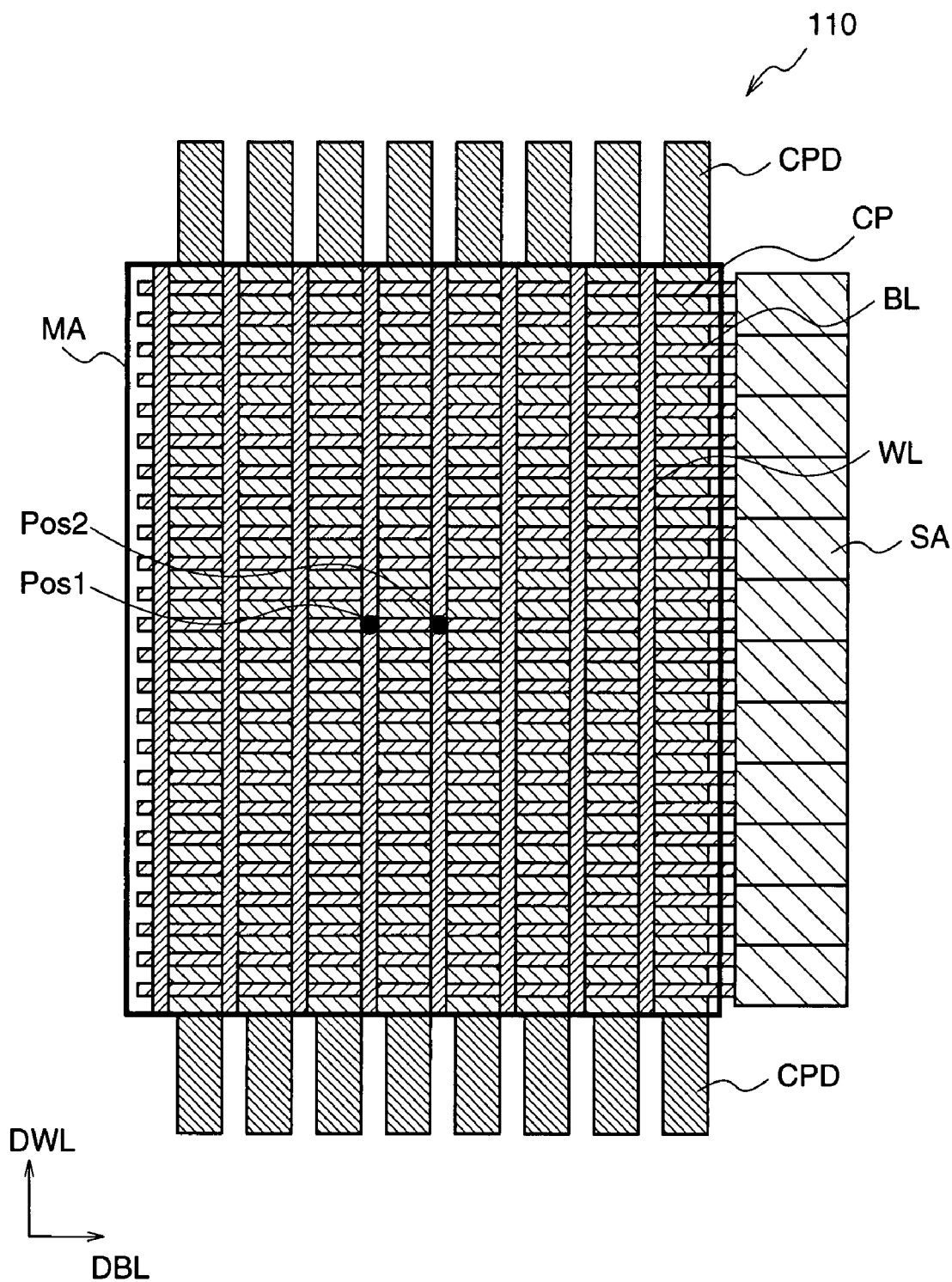
FIG. 4 is a plan view of a semiconductor memory device 110 according to the first prior art.
Figure 5:
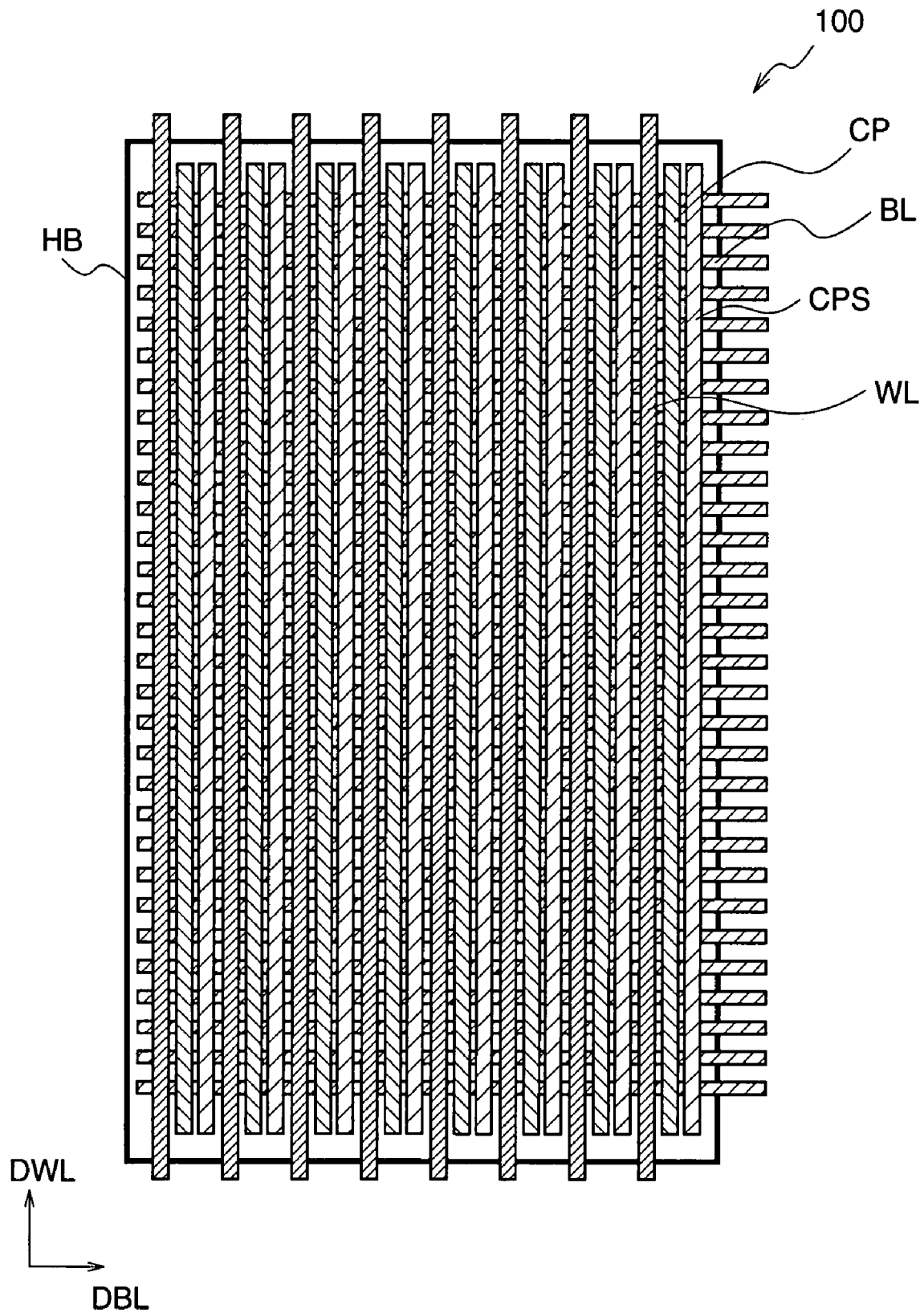
FIG. 5 is a plan view of a semiconductor memory device 100 according to a first embodiment of the present invention.

FIG. 5 is a plan view of a semiconductor memory device 100 according to the first embodiment of the present invention.

FIG. 9(*a*) is a plan view illustrating a partially enlarged portion of the plan view of the semiconductor memory device 100 shown in FIG. 5. FIG. 9(*b*) is a cross-sectional view taken along a line A102-A102' in FIG. 9(*a*), FIG. 9(*c*) is a cross-sectional view taken along a line A101-A101' in FIG. 9(*a*), FIG. 9(*d*) is a cross-sectional view taken along a line B101-B101' in FIG. 9(*a*), and FIG. 9(*e*) is a schematic circuit diagram of FIG. 9(*a*). In FIG. 9(*a*), in order to explain a memory array, a hydrogen barrier film that actually covers the entire surface of the memory array is omitted.

Initially, as seen from FIG. 5, the semiconductor memory device 100 according to the first embodiment includes plate lines CP, plate voltage supply lines CPS, and word lines WL, which extend in a column direction (DWL direction), and bit lines BL extending in a row direction (DBL direction). The memory array and the plate lines CP are entirely enclosed with a hydrogen barrier film HB.

Next, as seen from FIGS. 9(*a*)-9(*e*), a memory transistor is constituted by a diffused layer OD formed on a semiconductor substrate, and a word line WL formed on the semiconductor substrate. The diffused layer OD is electrically connected to the bit line BL that is formed beneath the hydrogen barrier film HB, by a bit line contact CB, and to a capacitor lower electrode (storage node SS) by a capacitor contact CS.

On the storage node SS, a capacitor ferroelectric film FE and a capacitor upper electrode (plate line CP) are disposed from the bottom upward, and a capacitor is constituted by these elements.

The plate line CP is connected to the plate voltage supply line CPS that is formed of a layer different from those of the diffused layer OD and the word line WL, through a plate line voltage supply contact CSP, the storage node SS, and the capacitor contact CS.

Further, each plate voltage supply line CPS is connected to the plate line CP at plural positions in the column direction (DWL direction) through the capacitor contact CS and the plate line voltage supply contact CSP. Further, a plate line voltage is supplied from a plate line voltage supply circuit (not shown) to each of the plural plate voltage supply lines CPS.

As described above, in the semiconductor memory device 100 according to the first embodiment, the plate lines are provided in the same construction with respect to the connection relationship with the plural memory cells, as the construction of the plural word lines that are commonly connected to the respective memory cells, and further, the semiconductor memory device 100 is provided with the means for electrically connecting the plural plate voltage supply lines arranged in the column direction to the plural plate lines corresponding to the respective plate voltage supply lines, and furthermore, the plate voltage supply lines are composed of a material having a resistance lower than that of the plate lines, each of the plural capacitors is enclosed with the hydrogen barrier film, the plural plate voltage supply lines are disposed beneath the hydrogen barrier film, and the plural plate voltage supply lines are, when viewed in a plane, electrically connected to the same plate line at plural positions of the same plate line, within a region where the hydrogen barrier film is disposed. Therefore, voltage to the plate lines can be supplied from the plate line voltage supply lines having a resistance lower than that of the plate lines through the plural points, thereby avoiding delay in plate line driving, and achieving stable plate line voltage and high-speed plate line driving.

More specifically, since voltage can be supplied from the plate voltage supply lines CPS to the plate lines CP concurrently through the plural positions, delay in the plate lines is avoided, and the speed of driving the plate lines is increased.

Further, since the plate voltage supply lines CPS are disposed beneath the hydrogen barrier film HB, it is not necessary to divide the hydrogen barrier film, in contrast to the case where the plate lines CP are connected to the plate voltage supply lines disposed above the hydrogen barrier film HB, thereby easily reducing the area of the device.

Further, in this first embodiment, since the plate lines CP also serve as the upper electrodes of the capacitors of the memory cells, the plate lines can be formed without newly providing a wiring layer, and thereby the semiconductor memory device can be easily fabricated with no increase in process steps.

While in this first embodiment the plate line voltage supply lines CPS are composed of a layer that is different from the diffused layer OD and the word lines WL, the plate line voltage supply lines CPS may be composed of the same layer as either the diffused layer OD or the word lines WL. In this case, the semiconductor memory device can be easily fabricated because no increase in process steps is required.

Furthermore, while voltage is supplied to each plate line CP from the plural positions in the corresponding plate line voltage supply line CPS in the column direction, the number of the connection points may be smaller or larger than mentioned above so long as the connection points do not cause temporal and local undershoot or overshoot of the voltage to the plate line, which leads to degradation in data holding of nonoperating memory cells that are disposed in the vicinity of operating memory cells. In this case, particularly, the voltage supply points should be arranged and constituted so as to reduce the area of the memory cell array MA.

Furthermore, in the semiconductor memory device according to the first embodiment, it is desirable to use a power supply wiring for the plate voltage supply lines CPS. Since this construction does not need a new voltage generation circuit for generating a plate voltage, reduction in the area of the memory circuit can be achieved.

Moreover, while in this first embodiment the capacitor of the memory cell is a ferroelectric capacitor using a ferroelectric film as an insulating film for the capacitor, the capacitor of the memory cell may be a high dielectric capacitor using a high dielectric film as an insulating film for the capacitor.

Embodiment 2

Hereinafter, a second embodiment of the present invention will be described with reference to FIGS. 6(a) and 10(a)-10(e).

Figure 6A:
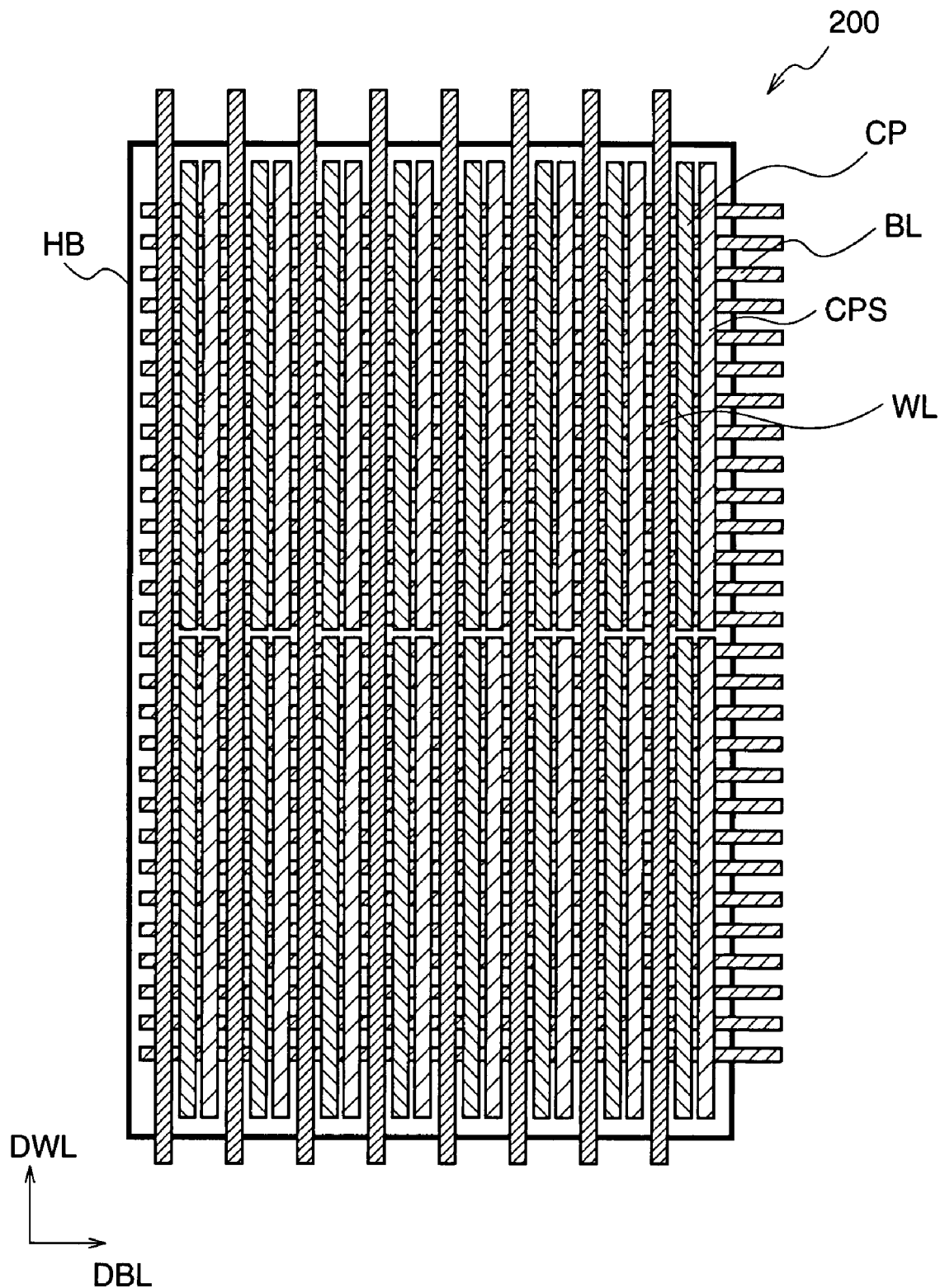
FIG. 6(a) is a plan view of a semiconductor memory device 200 according to a second embodiment of the present invention.

FIG. 6(a) is a plan view of a semiconductor memory device 200 according to the second embodiment of the present invention.

Figure 10A:
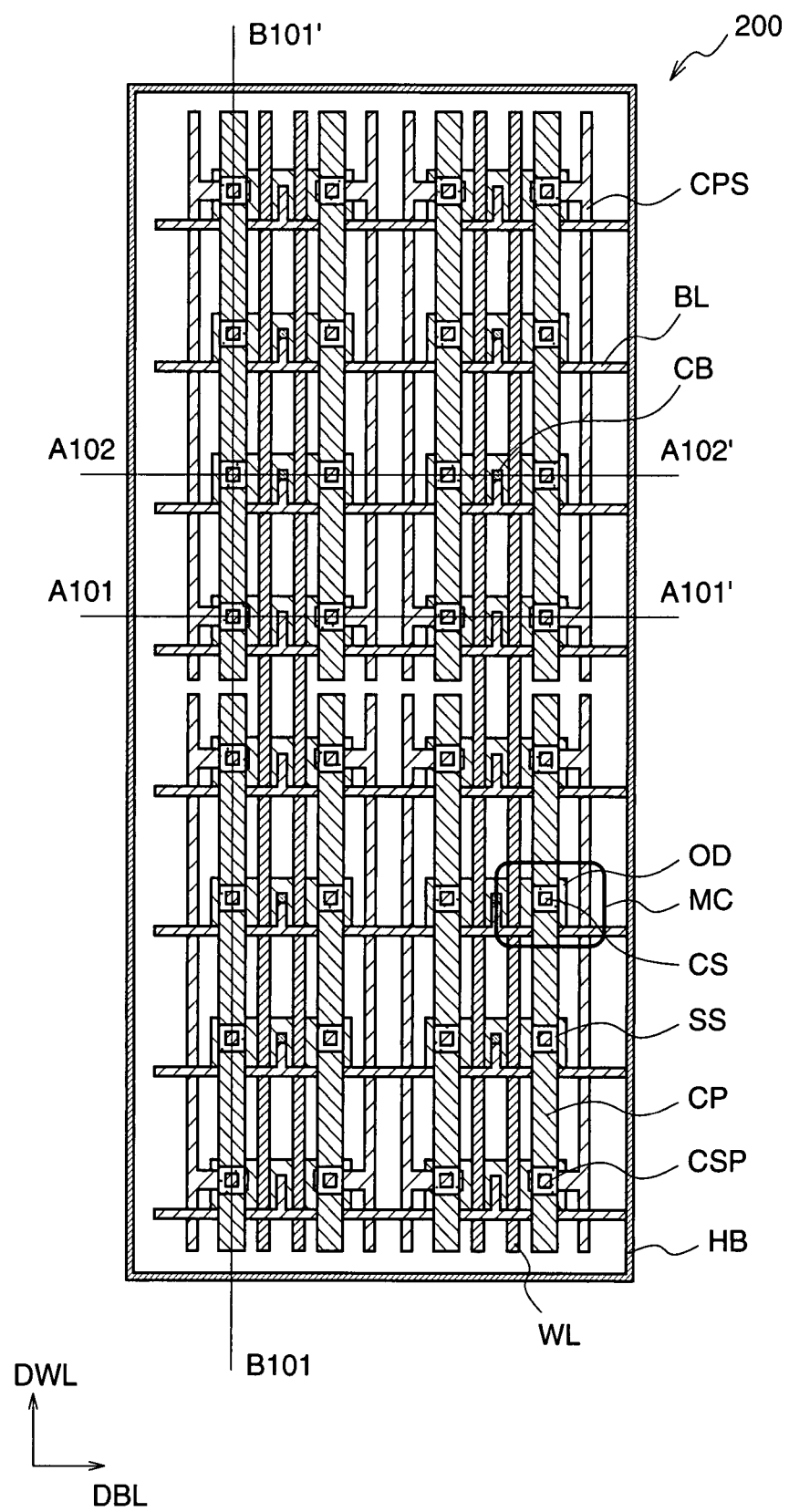
FIG. 10(*a*) is a partially enlarged plan view of the semiconductor memory device 200 according to the second embodiment.
Figure 10B:
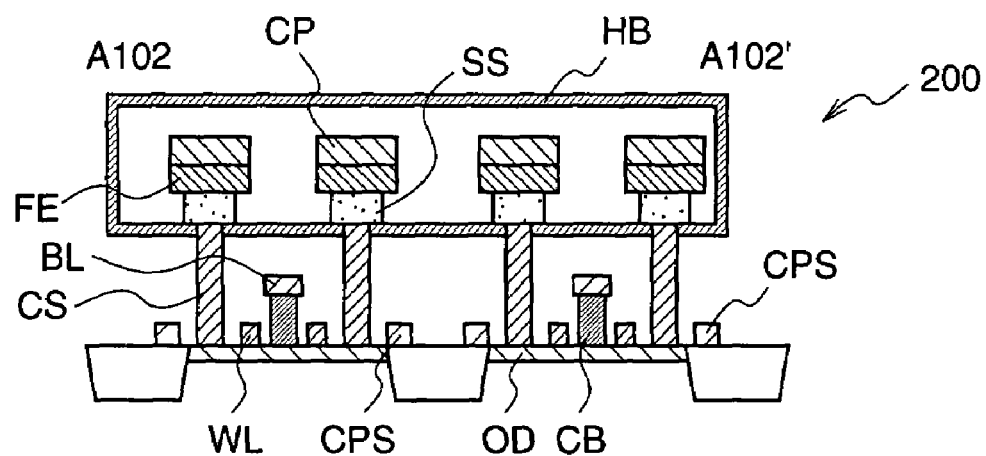
Figure 10C:
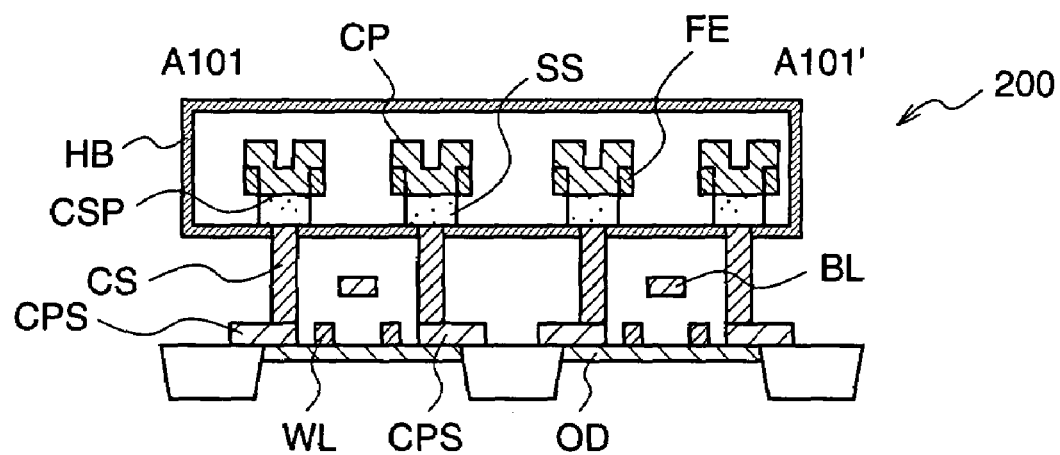
Figure 10D:
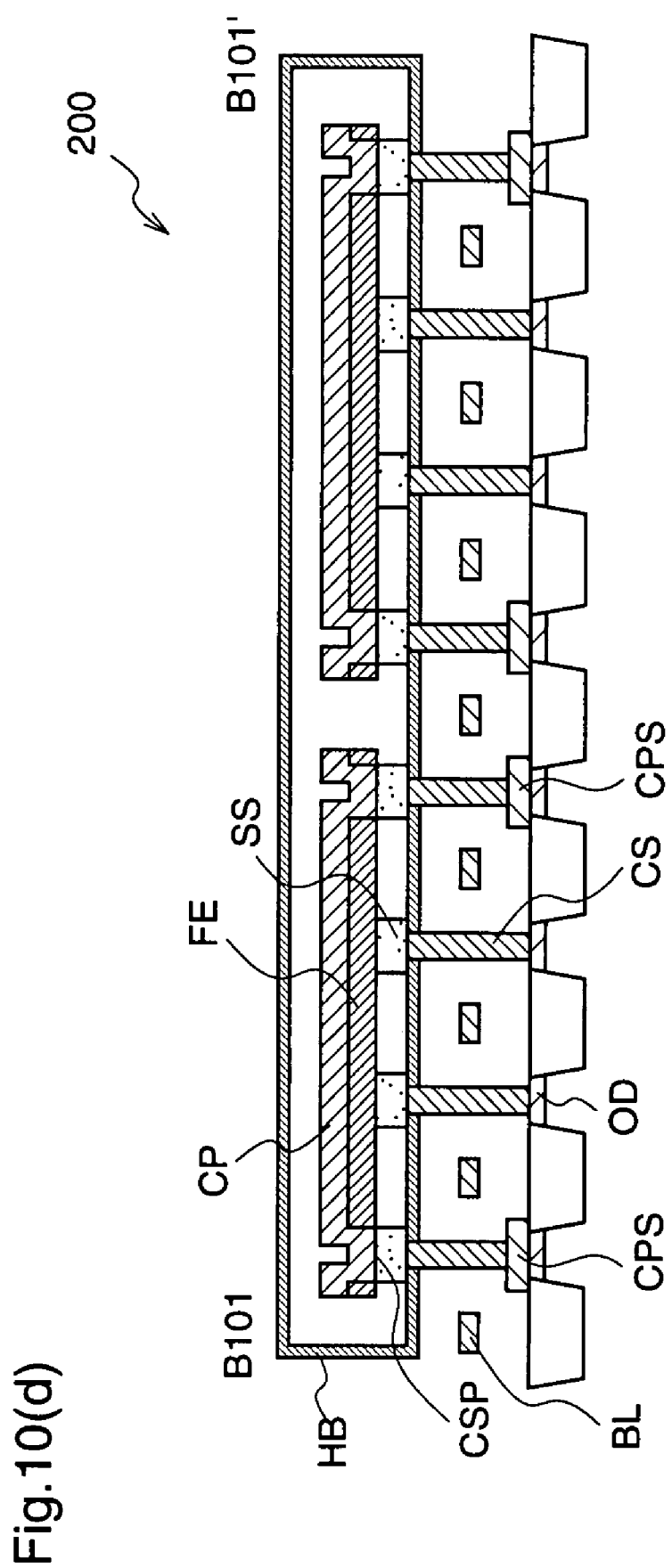
Figure 10E:
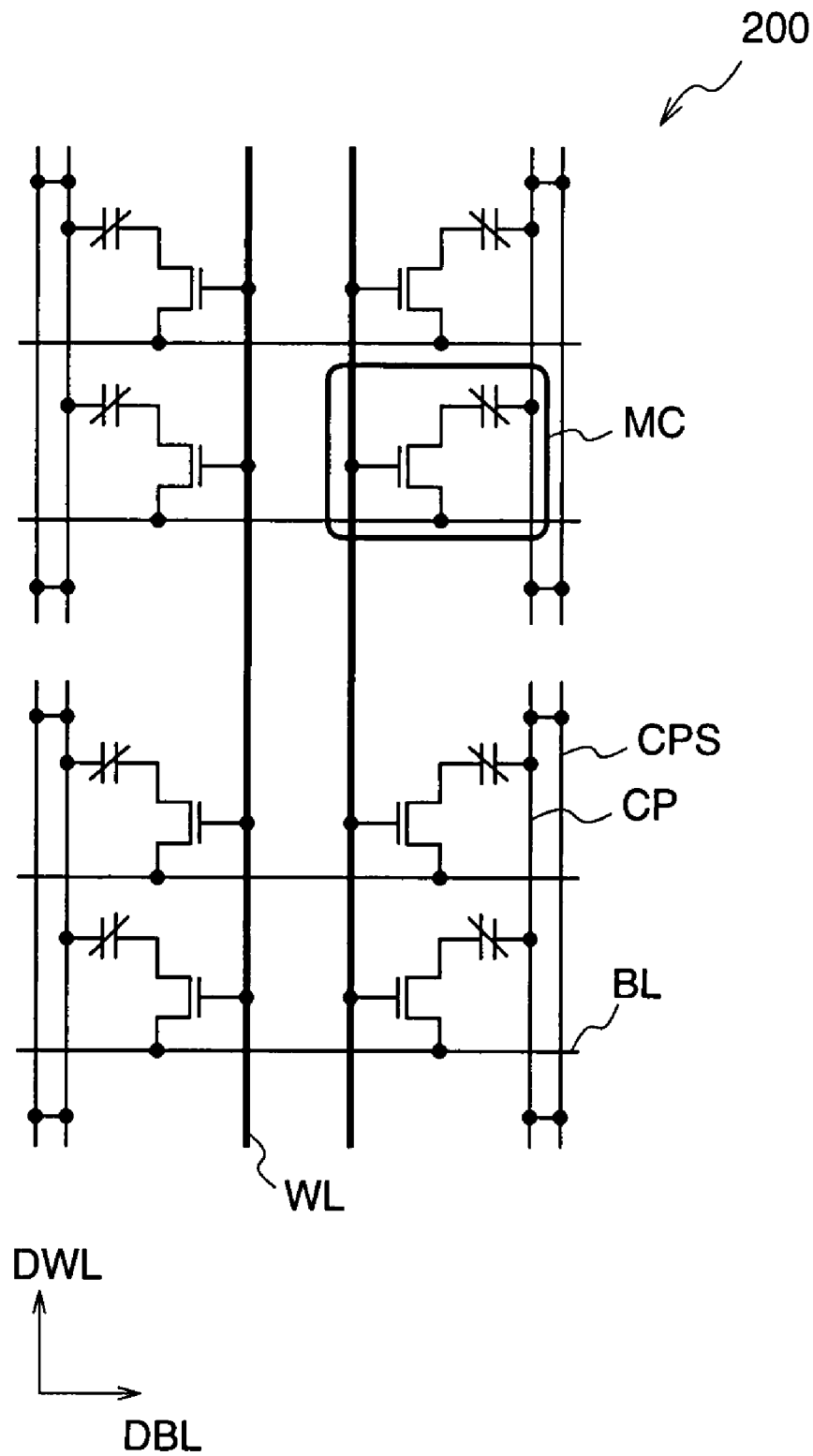

FIG. 10(a) is a plan view illustrating a partially enlarged portion of the plan view of the semiconductor memory device 200 shown in FIG. 6(a). FIG. 10(b) is a cross-sectional view taken along a line A102-A102' in FIG. 10(a), FIG. 10(c) is a cross-sectional view taken along a line A101-A101' in FIG. 10(a), FIG. 10(d) is a cross-sectional view taken along a line B101-B101' in FIG. 10(a), and FIG. 10(e) is a schematic circuit diagram of FIG. 10(a). In FIG. 10(a), in order to explain a memory array, a hydrogen barrier film that actually covers the entire surface of the memory array is omitted.

Hereinafter, initially a description will be given of differences between the second embodiment and the first embodiment.

While in the first embodiment the number of memory cells relating to one word line WL is equal to the number of memory cells relating to one plate line CP, in this second embodiment the number of memory cells relating to one word line WL is different from the number of memory cells relating to one plate line CP. In this second embodiment, the number of memory cells relating to one plate line CP is smaller than the number of memory cells relating to one word line WL.

More specifically, as shown in FIG. 6(a), while the word line WL extending in the column direction (DWL direction) in one memory array is a continuous single line, the plate line CP extending in the column direction (DWL direction) is divided into two lines in the center.

In the semiconductor memory device 200 according to the second embodiment, like the semiconductor memory device 100 according to the first embodiment, voltage is supplied to each plate line through plural positions in the plate line voltage supply line CPS having a resistance lower than that of the plate line, thereby preventing delay in plate line drive, and achieving stable plate line voltage and high-speed plate line drive, and moreover, the following effects are achieved.

That is, first of all, since each plate line CP is divided, the load capacity of one plate line CP can be reduced. Therefore, delay in driving the plate lines CP can be further prevented, and thereby the speed of driving the plate lines CP can be further increased, and the voltage of the plate lines CP can be more stabilized, and furthermore, the area of each plate line voltage supply circuit can be further reduced.

Furthermore, in this second embodiment, since the plate lines CP also serve as the upper electrodes of the capacitors of the memory cells, the plate lines can be formed without newly providing a wiring layer, and therefore, the semiconductor memory device can be easily fabricated with no increase in process steps.

While in this second embodiment the plate line voltage supply lines CPS are formed of a layer that is different from the diffused layer OD and the word lines WL as in the first embodiment, the plate line voltage supply lines CPS may be formed of the same layer as either the diffused layer OD or the word lines WL. In this case, the semiconductor memory device can be easily fabricated because no increase in process steps is needed.

Further, while voltage is supplied to each plate line CP from plural positions in the plate line voltage supply line CPS in the column direction, the number of the connection positions may be smaller or larger than that mentioned above so long as temporal and local undershoot or overshoot does not occur, which leads to degradation in data holding of nonoperating memory cells that are placed around operating memory cells. In this case, it is particularly desired to perform arrangement and constitution so as to reduce the area of the memory cell array MA.

Further, also in the semiconductor memory device according to the second embodiment, it is desired to use a power supply wiring for the plate voltage supply lines CPS as in the first embodiment. Since this construction does not require a new voltage generation circuit for generating a plate voltage, the area of the memory circuit can be reduced.

Further, while the capacitor of each memory cell is a ferroelectric capacitor using a ferroelectric film as an insulating film for the capacitor, the capacitor of the memory cell may be a high dielectric capacitor using a high dielectric film as an insulating film of the capacitor.

Embodiment 3

Hereinafter, a third embodiment of the present invention will be described with reference to FIGS. 6(b) and 11(a)-11(e).

Figure 6B:
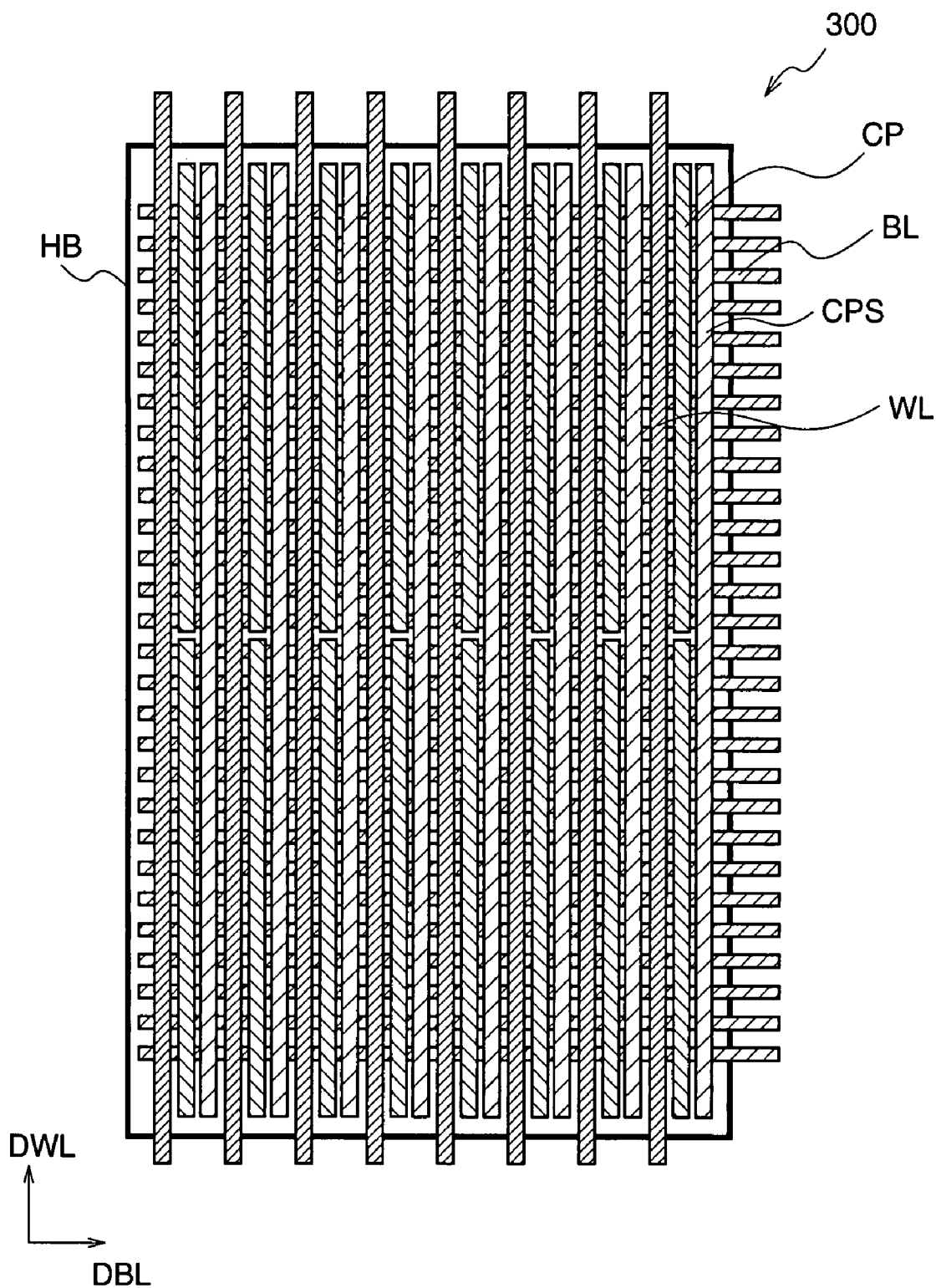
FIG. 6(b) is a plan view of a semiconductor memory device 300 according to a third embodiment of the present invention.

FIG. 6(b) is a plan view of a semiconductor memory device 300 according to the third embodiment of the present invention.

Figure 11A:
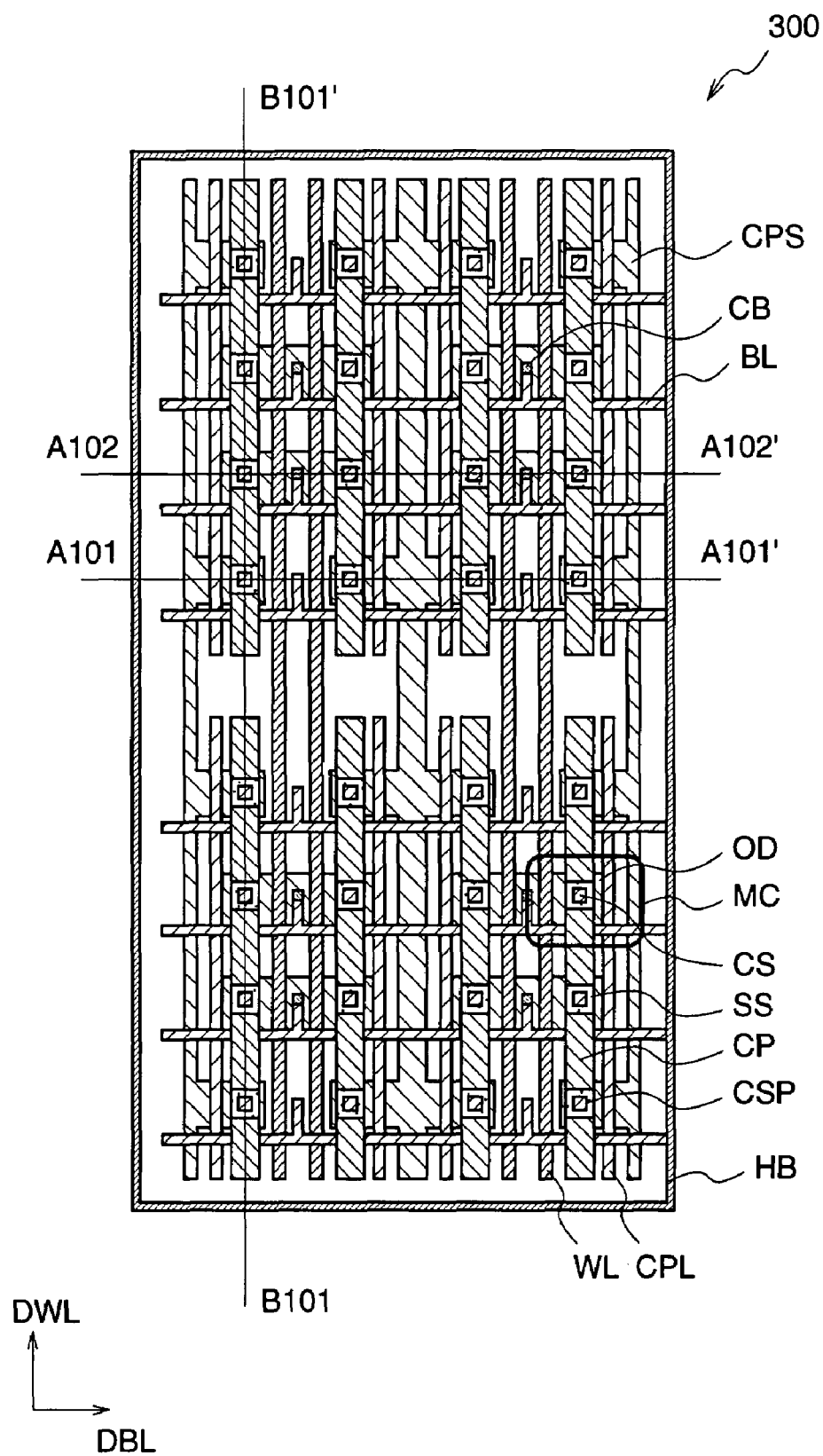
FIG. 11(*a*) is a partially enlarged plan view of the semiconductor memory device 300 according to the third embodiment.
Figure 11B:
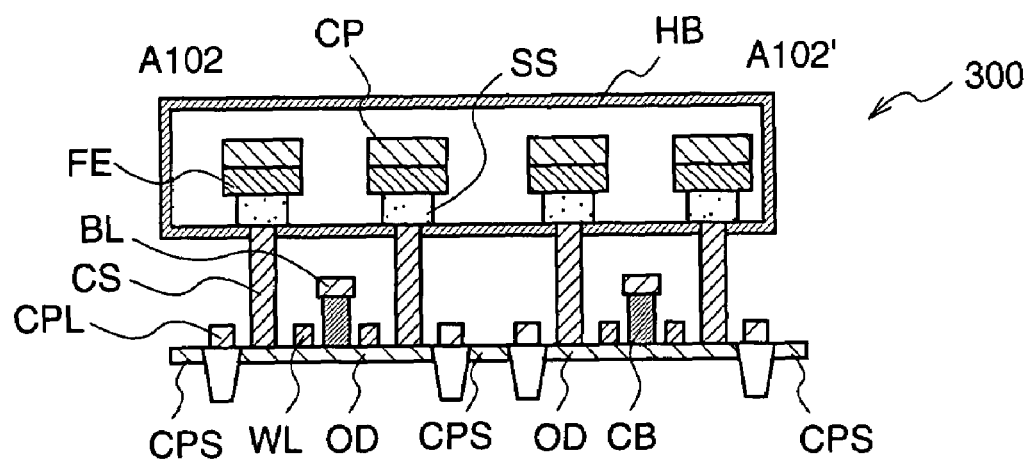
Figure 11C:
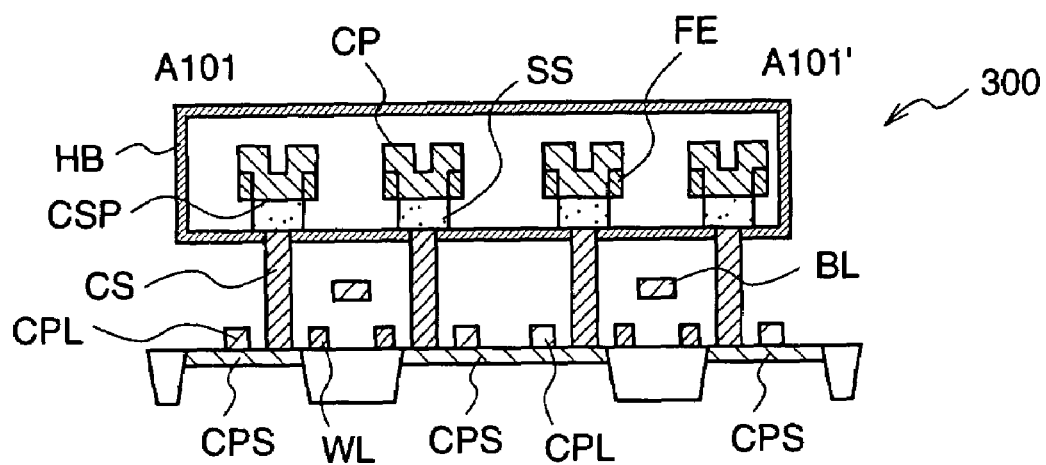
Figure 11E:
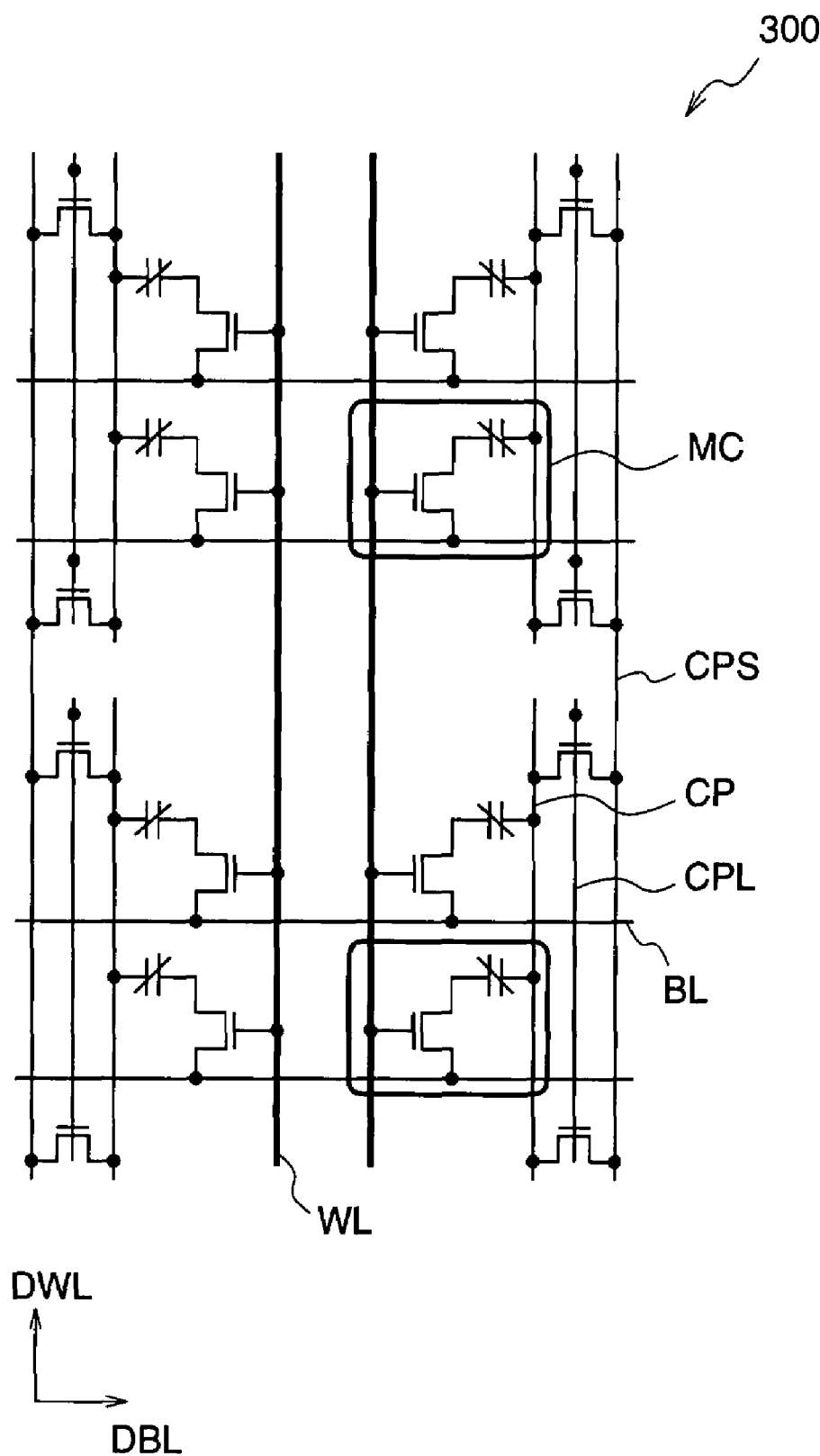

FIG. 11(a) is a plan view illustrating a partially enlarged portion of the plan view of the semiconductor memory device 300 shown in FIG. 6(b). FIG. 11(b) is a cross-sectional view taken along a line A102-A102' in FIG. 11(a), FIG. 11(c) is a cross-sectional view taken along a line A101-A101' in FIG. 11(a), FIG. 11(d) is a cross-sectional view taken along a line B101-B101' in FIG. 11(a), and FIG. 11(e) is a schematic circuit diagram of FIG. 11(a). In FIG. 11(a), in order to explain a memory array, a hydrogen barrier film that actually covers the entire surface of the memory array is omitted.

Hereinafter, a description will be given of differences between the third embodiment and the second embodiment.

While in the second embodiment each plate voltage supply lines CPS is directly connected to the plate line CP using the wiring layer, in this third embodiment the plate voltage supply line CPS is formed of a diffused layer, and supplies voltage to the plate line CP through a transistor.

More specifically, as shown in FIG. 11, the plate voltage supply line CPS formed on a diffused layer is selectively connected to the plate line CP by a plate line voltage supply selection line CPL of a gate of a transistor.

In the semiconductor memory device 300 according to the third embodiment, like the semiconductor memory device 100 according to the first embodiment, voltage to each plate line can be supplied through plural positions in the plate line voltage supply line having a resistance lower than that of the plate line, thereby avoiding delay in plate line driving, and achieving stable plate line voltage and high-speed plate line driving, and moreover, the following effects can be achieved.

That is, since the gate of the transistor connected to the plate line voltage supply line CPS is constituted not by the word line WL but by the plate line voltage supply selection line CPL, the plate line CP can be driven asynchronously with the word line WL. As a result, the voltage of the plate line voltage supply line CPS can be fixed, thereby achieving speed-up of the circuit.

Further, since the voltage of the plate line voltage supply line CPS is fixed, driving of the plate line voltage supply line CPS is not required, thereby reducing the circuit scale of the plate line voltage supply circuit, and further, reducing power consumption of the plate line voltage supply circuit. Thus, reduction in the area of the plate line voltage supply circuit CPD can be achieved.

Further, since a desired number of plate lines CP among the plural plate lines CP that are separated in the word line direction can be driven by the single plate voltage supply line CPS, reduced area and reduced power consumption can be achieved.

Furthermore, voltage can be supplied to the plate voltage supply line CPS before operation is started, and the voltage can be supplied to the plate line CP through the transistor as a connection means when operation is performed. Therefore, the path for transmitting the voltage to the plate line CP is shortened, whereby supply of the voltage to the plate line is speedily carried out, leading to further speed-up.

Furthermore, in this third embodiment, since the plate lines CP also serve as the upper electrodes of the capacitors of the memory cells, the plate lines can be formed without newly provided a wiring layer, and therefore, the semiconductor memory device can be easily fabricated with no increase in process steps.

Furthermore, while in this third embodiment the plate line voltage supply line CPS is formed of the same layer as the diffused layer, it may be formed of the same layer as the word line WL. Also in this case, the semiconductor memory device can be easily fabricated because no increase in process steps is required. Further, the plate line voltage supply line CPS may be formed of a layer that is different from the diffused layer OD and the word line WL. In this case, it is desired that the plate line voltage supply line CPS should be formed and arranged so that the resistance thereof is reduced as compared with the case where it is formed of the same layer as the diffused layer OD or the word line WL.

Further, while voltage is supplied to the plate line CP from plural positions in the plate line voltage supply line CPS in the column direction, the number of the voltage supply positions may be smaller or larger than mentioned above so long as the power supply positions do not cause temporal and local undershoot or overshoot of the voltage to the plate line, which leads to degradation in data holding of nonoperating memory cells that are disposed in the vicinity of operating memory cells. In this case, particularly it is desired that the voltage supply positions should be arranged and constituted so as to reduce the area of the memory cell array MA.

Furthermore, while in this third embodiment the gate of the transistor connected to the plate line voltage supply line CPS is constituted by the plate line voltage supply selection line CPL, the gate of the transistor may be connected to the adjacent word line. In this construction, the plate line CP can be driven synchronously with the word line WL, and thereby the circuit construction and the operation system can be simplified. Further, since the word line and the gate of the transistor can be constituted by a common wiring, further reduction in the area of the memory cell is achieved.

Moreover, also in the semiconductor memory device according to the third embodiment, it is desired to use a power supply wiring for the plate voltage supply line CPS as in the semiconductor memory device of the first embodiment. In this construction, since a new voltage generation circuit is not required for generating plate voltage, the area of the memory circuit can be reduced.

Furthermore, while in this third embodiment the capacitor of the memory cell is a ferroelectric capacitor using a ferroelectric film as an insulating film for the capacitor, the capacitor of the memory cell may be a high dielectric capacitor using a high dielectric film as an insulating film for the capacitor.

Embodiment 4

Hereinafter, a semiconductor memory device according to a fourth embodiment of the present invention will be described with reference to FIGS. 7, 8, and 12(a)-12(e).

Figure 7:
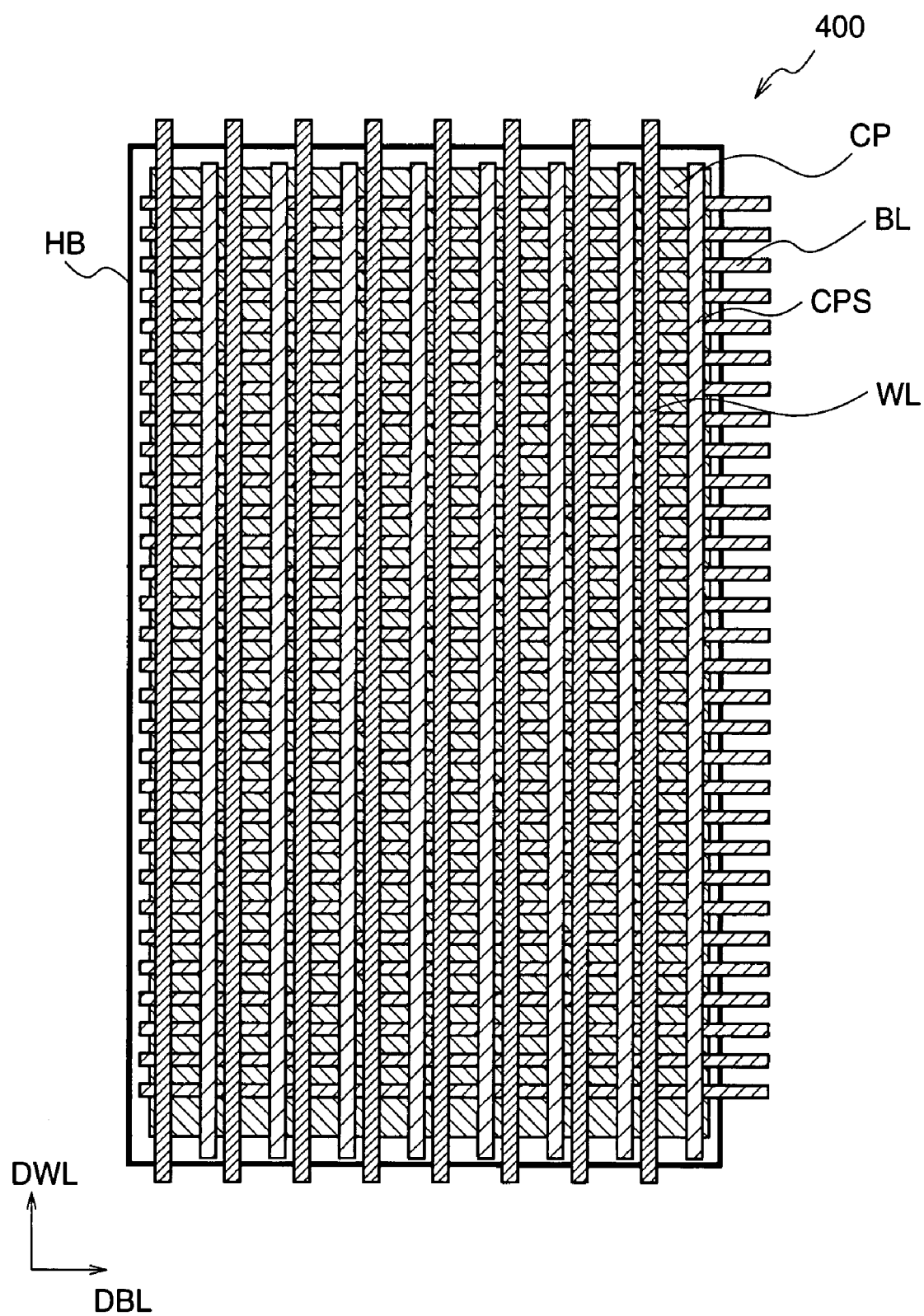
FIG. 7 is a plan view of a semiconductor memory device 400 according to a fourth embodiment of the present invention.
Figure 8:
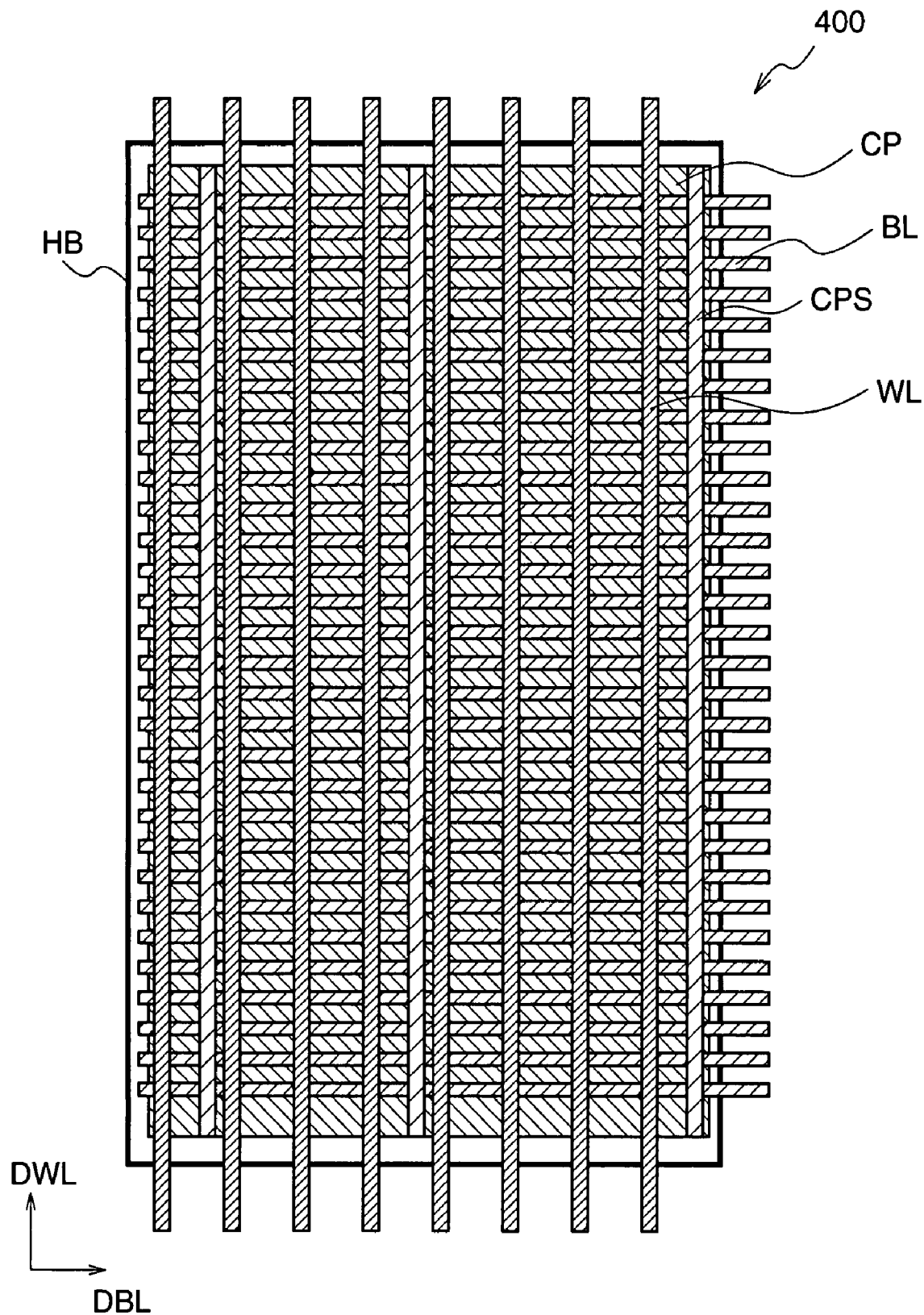
FIG. 8 is a plan view of another example of a semiconductor memory device 400 according to the fourth embodiment.
Figure 9A:
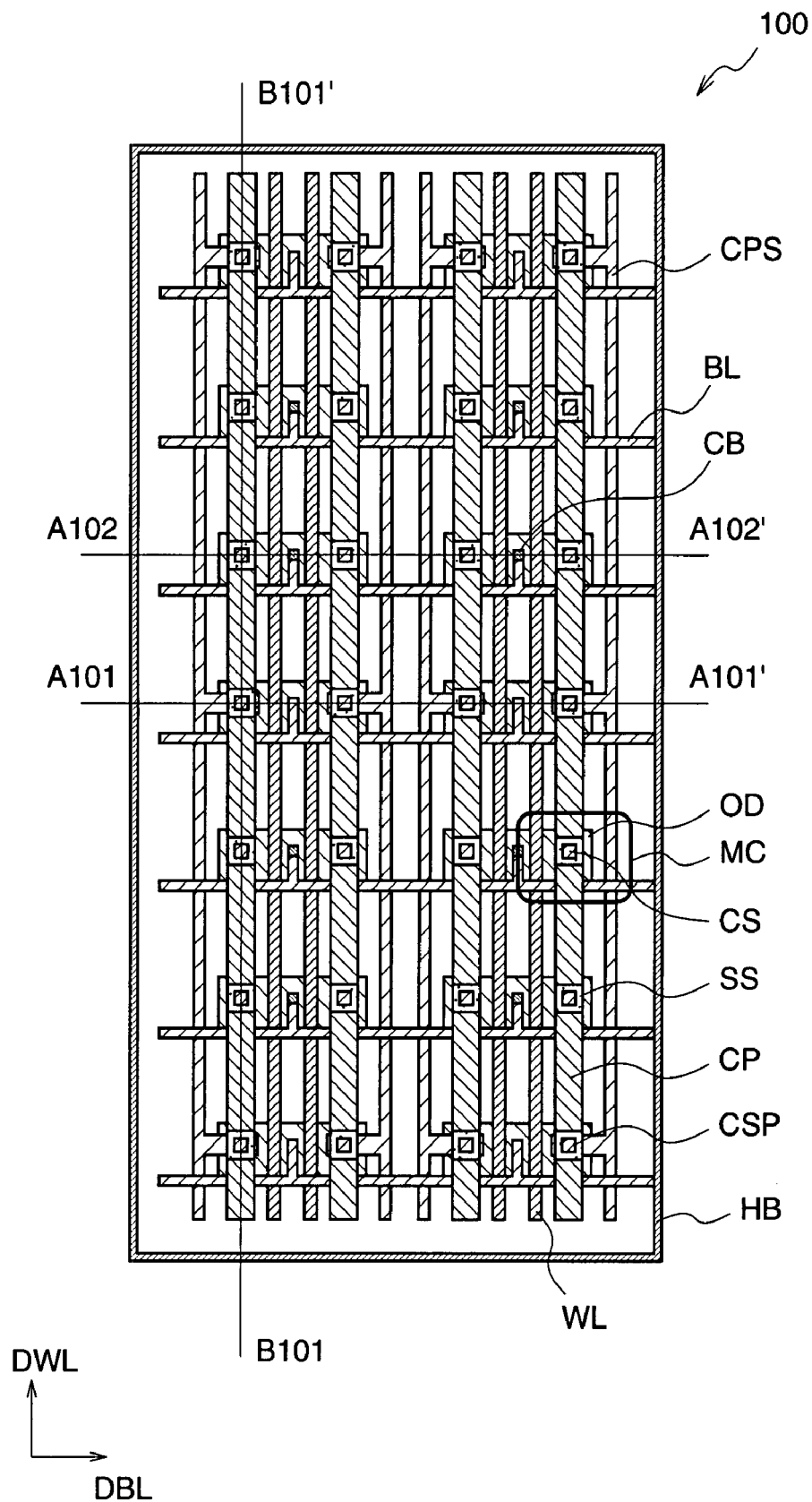
FIG. 9(*a*) is a partially enlarged plan view of the semiconductor memory device 100 according to the first embodiment.
Figure 9B:
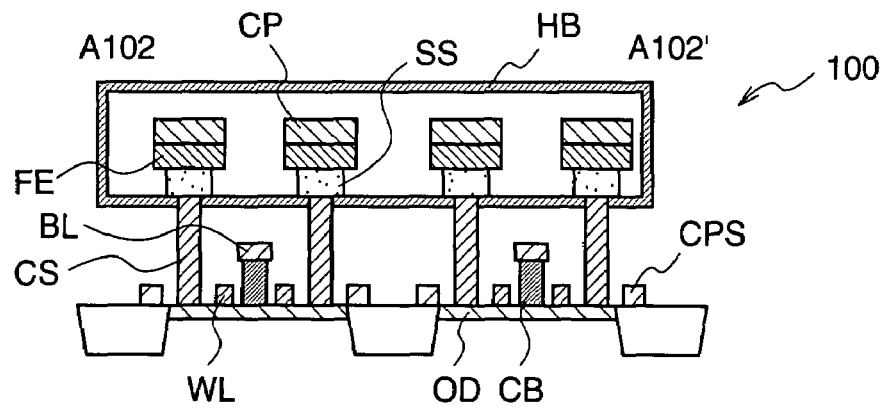
Figure 9C:
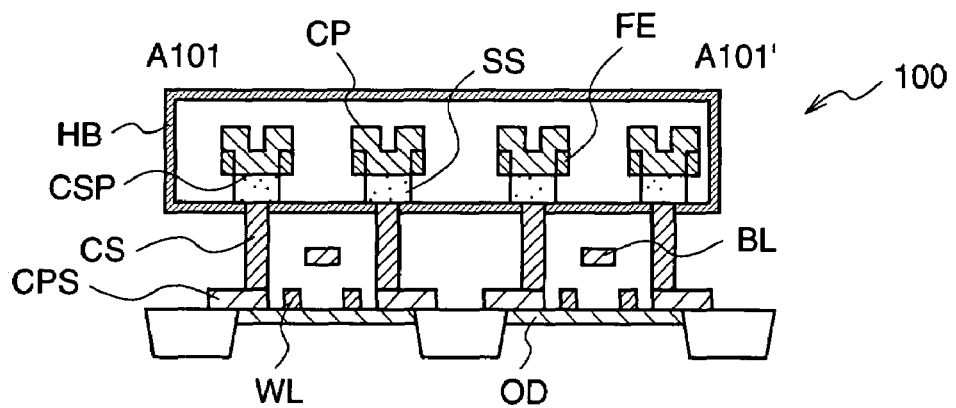
Figure 9D:
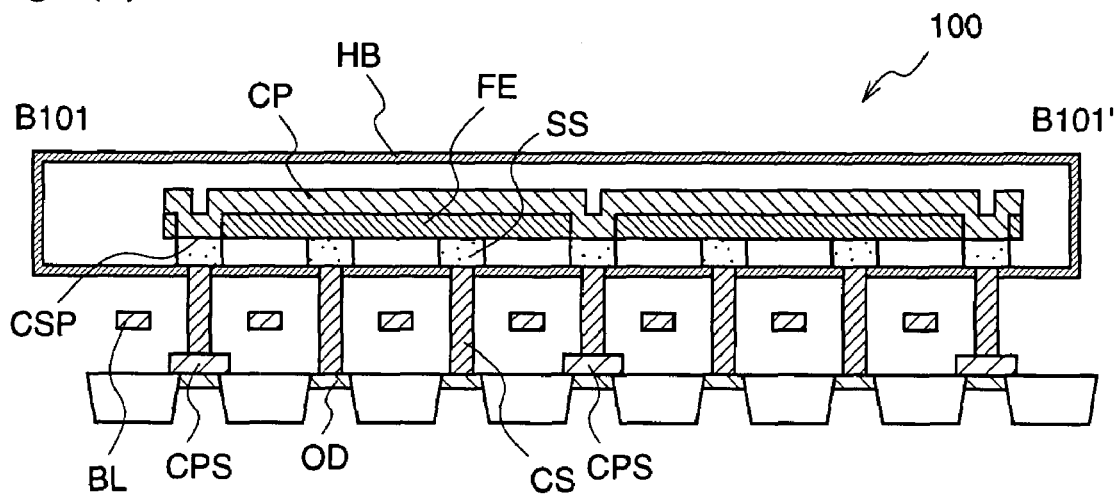
Figure 9E:
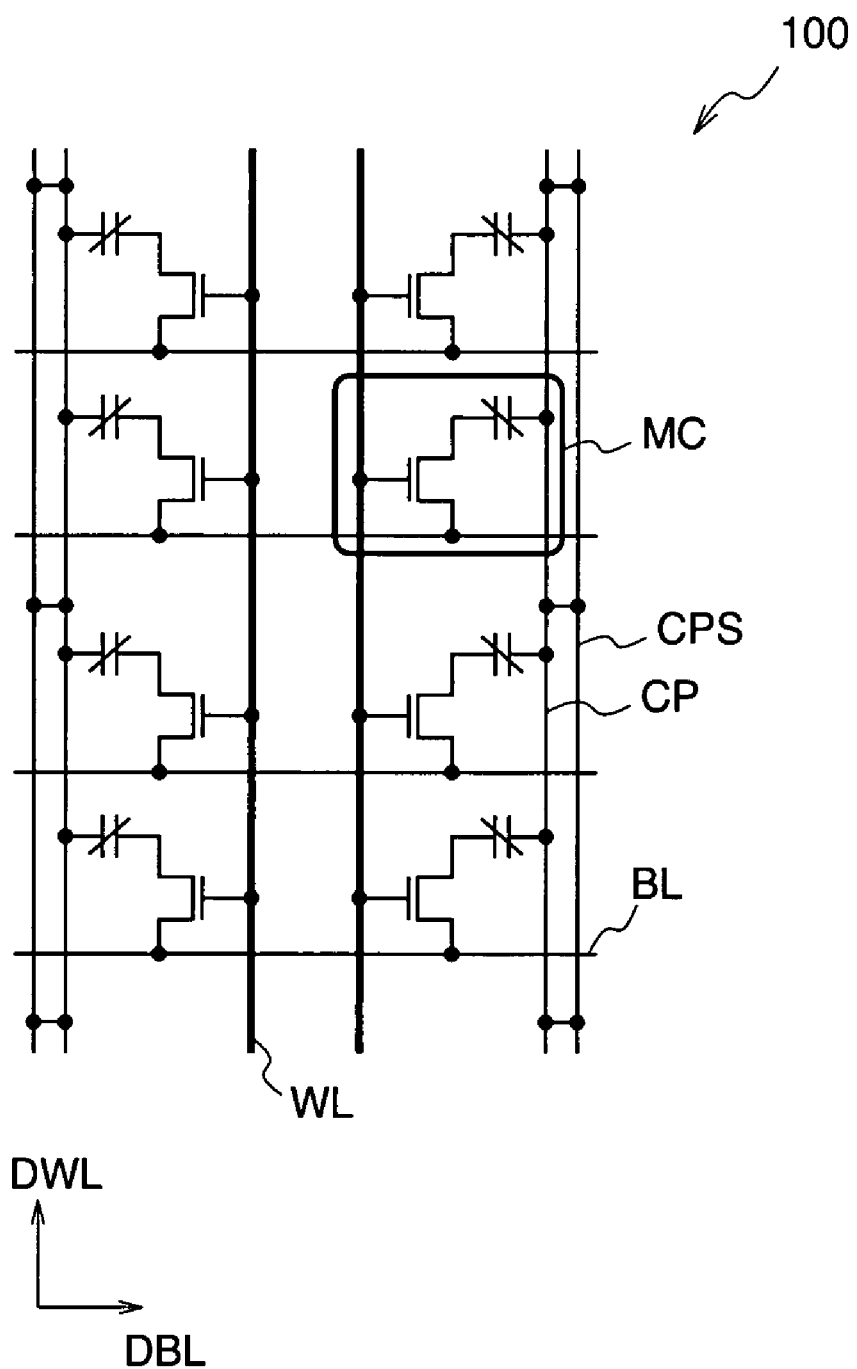

FIGS. 7 and 8 are plan views illustrating an example of a semiconductor memory device 400 according to the fourth embodiment, and another example thereof, respectively.

Figure 12A:
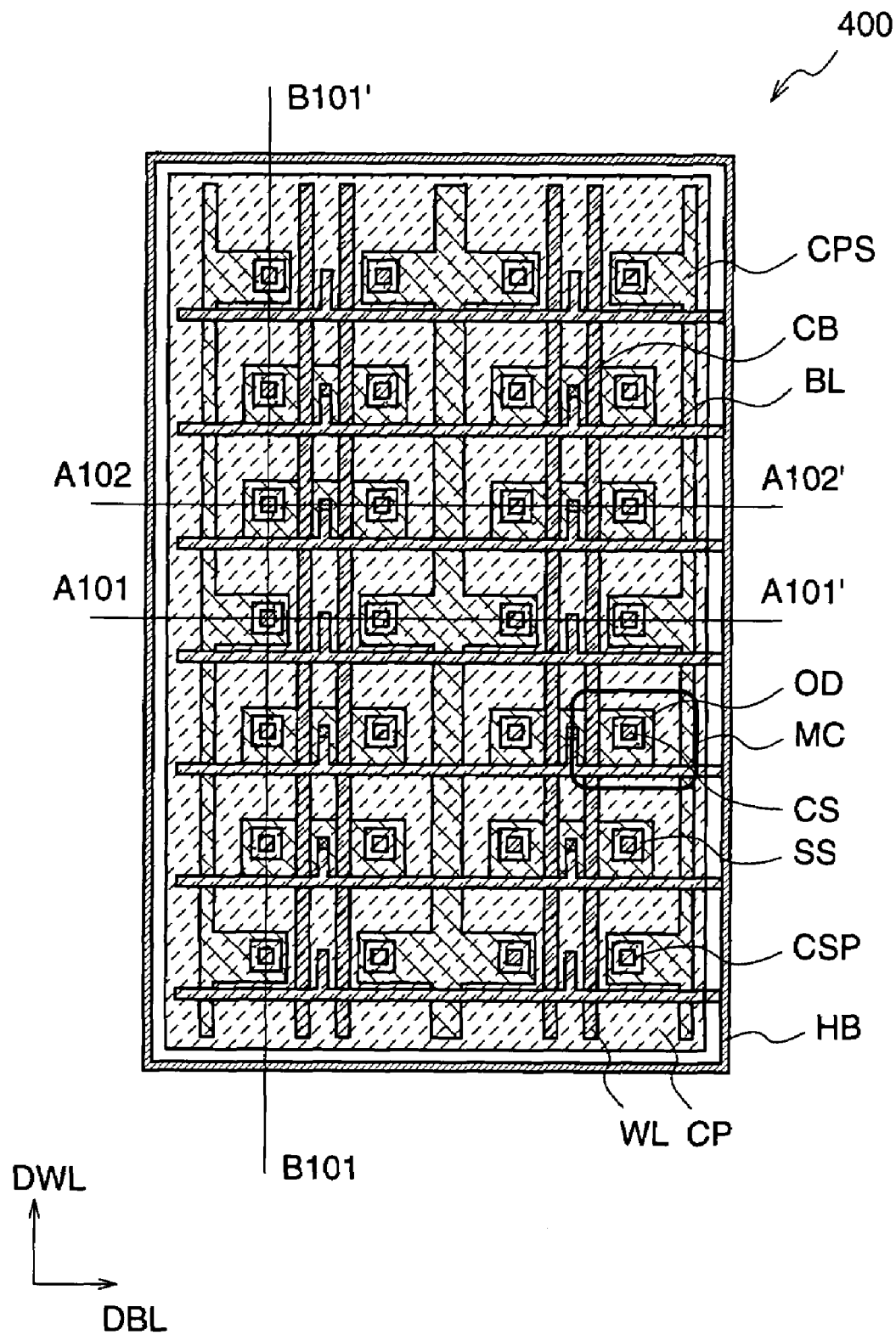
FIG. 12(*a*) is a partially enlarged plan view of the semiconductor memory device 400 according to the fourth embodiment.
Figure 12B:
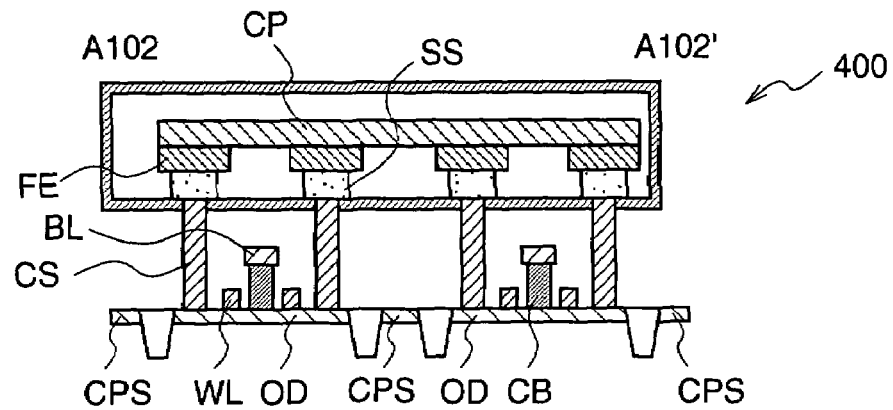
Figure 12C:
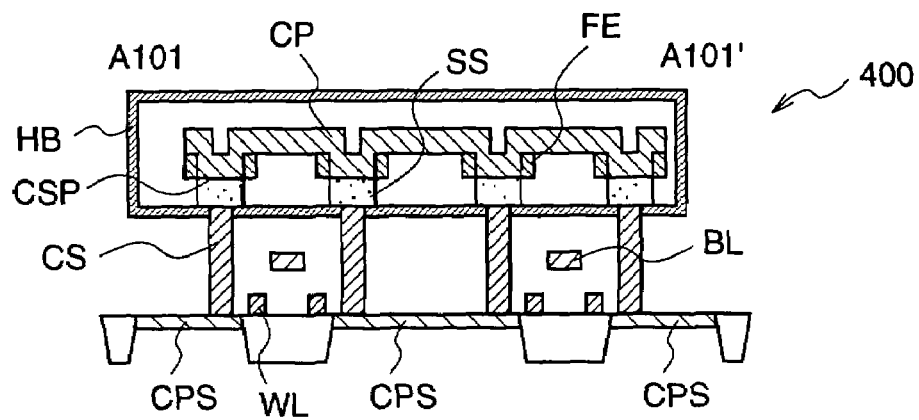
Figure 12D:
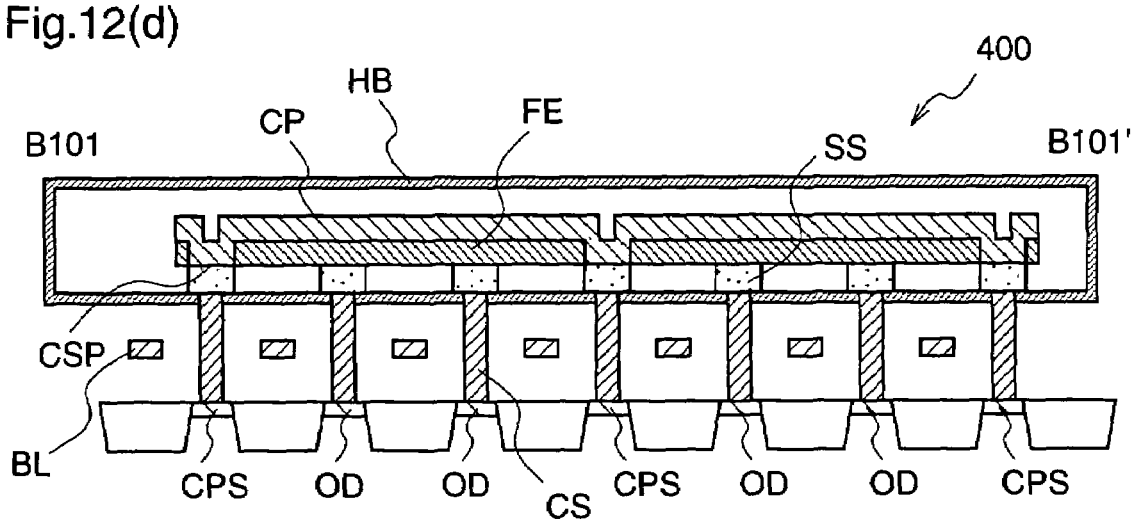
Figure 12E:
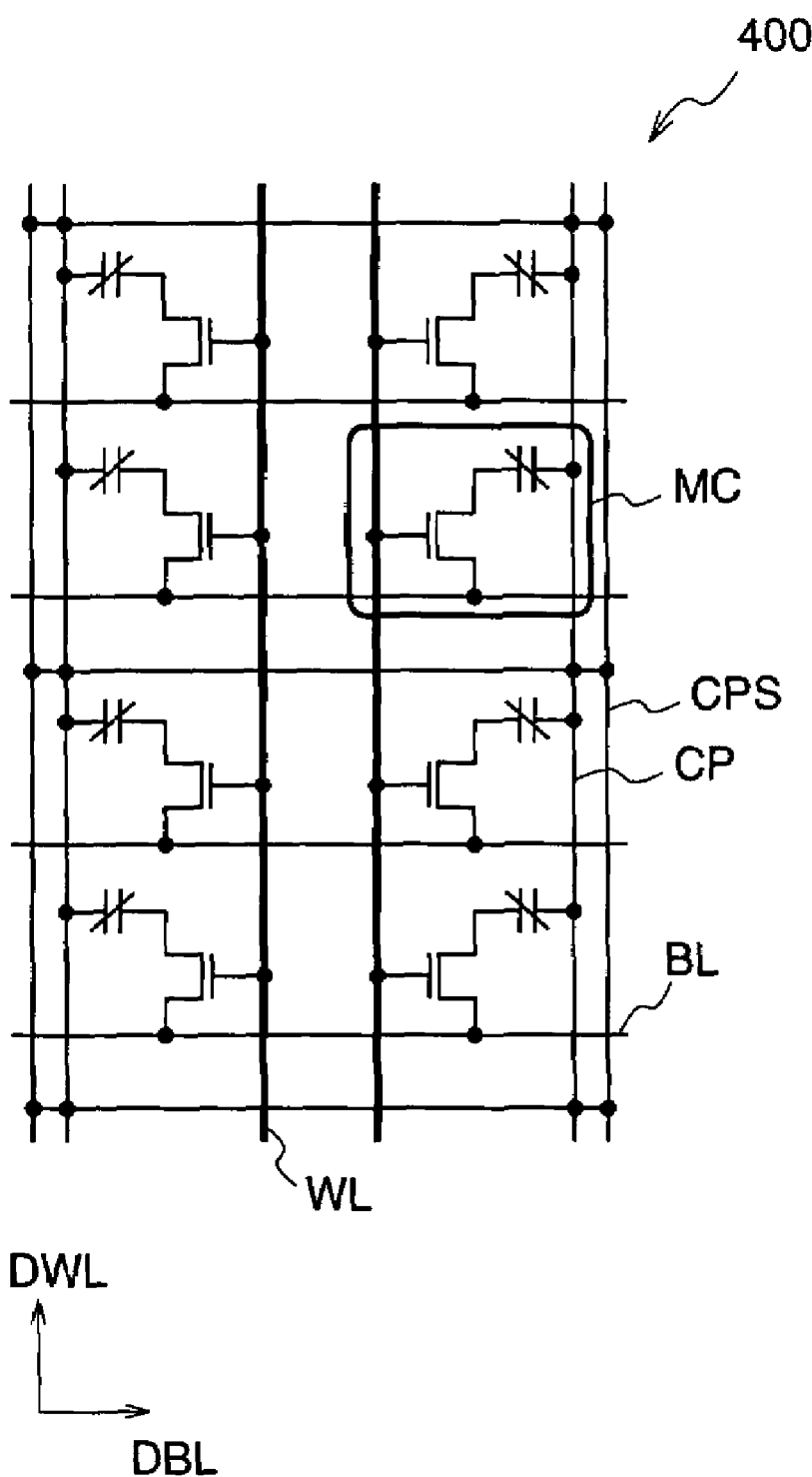

FIG. 12(a) is a plan view illustrating a partially enlarged portion of the plan view of the semiconductor memory device 400 shown in FIGS. 7 and 8, and the same FIG. 12(a) is obtained with respect to FIGS. 7 and 8. Further, FIG. 12(b) is a cross-sectional view taken along a line A102-A102' in FIG. 12(a), FIG. 12(c) is a cross-sectional view taken along a line A101-A101' in FIG. 12(a), FIG. 12(d) is a cross-sectional view taken along a line B101-B101' in FIG. 12(a), and FIG. 12(e) is a schematic circuit diagram of FIG. 12(a). In FIG. 12(a), in order to explain a memory array, a hydrogen barrier, film that actually covers the entire surface of the memory array is omitted.

Hereinafter, a description will be given of differences between the fourth embodiment and the first embodiment, with reference to FIGS. 5, 7, and 8.

While in the first embodiment the plural word lines WL extending in the column direction (DWL direction) and the plural plate lines CP as many as the word lines WL are arranged as shown in FIG. 5, in this fourth embodiment plural word lines WL extending in the column direction (DWL direction) and one plate line CP which is common to the plural word lines WL are arranged as shown in FIGS. 7 and 8. That is, in this fourth embodiment, one plate line CP is formed over the entire area of the memory array as shown in FIGS. 7 and 8.

FIGS. 7 and 8 are different from each other in that approximately the same number of plate line voltage supply lines CPS as the word lines WL are arranged in FIG. 7, while plate line voltage supply lines CPS less than the number of the word lines WL are arranged in FIG. 8.

Next, a description will be given of differences between the fourth embodiment and the first embodiment with reference to FIGS. 9(a)-9(e) and 12(a)-12(e).

While in the first embodiment the plural word lines WL extending in the column direction (DWL direction) and the plural plate lines CP as many as the word lines WL are arranged as shown in FIG. 9, in this fourth embodiment plural word lines WL extending in the column direction (DWL direction) and one plate line CP which is common to the plural word lines WL are arranged as shown in FIG. 12.

Further, while in the first embodiment the plate voltage supply line CPS is directly connected to the plate line CP by using the wiring layer as shown in FIG. 9, in this fourth embodiment the plate voltage supply line CPS is formed of a diffused layer, and supplies voltage to the plate line CP with no transistor intervening.

Further, while in the first embodiment the plate voltage supply line CPS is formed of a layer that is different from the diffused layer OD and the word line WL as shown in FIG. 9, in this fourth embodiment the plate voltage supply line CPS is formed of the same layer as the diffused layer OD as shown in FIG. 12.

Furthermore, in this fourth embodiment, the plate voltage supply line CPS that is formed of the diffused layer is directly connected to the plate line CP through the capacitor contact CS, the storage node SS, and the plate line voltage supply contact CSP, as shown in FIG. 12.

In the semiconductor memory device 400 according to the fourth embodiment, like the semiconductor memory device 100 according to the first embodiment, voltage is supplied to the plate line through plural positions in the plate line voltage supply line having a resistance lower than that of the plate line, thereby preventing delay in plate line drive, and achieving stable plate line voltage and high-speed plate line drive, and moreover, the following effects are achieved.

That is, in the construction of the fourth embodiment, an operation system with the voltage of the plate line CP being fixed can be easily obtained. Especially, when a specific memory cell is operated, in a non-operating memory cell that is disposed in the vicinity of the operating memory cell, the resistance of the plate line is high because supply of voltage to the plate line is usually performed at an end of the memory cell array MA, and thereby the voltage of the plate line is likely to occur temporal and local undershoot or overshoot, leading to degradation in data holding of the memory cell. In this fourth embodiment, however, supply of voltage to the plate line is performed not at an end of the memory cell array MA but voltage can be supplied to one plate line at plural positions in both the row direction and the column direction, whereby the voltage to the plate line can be further stabilized in a region near the center of the plate line, as compared with the prior art.

Further, in the construction of the fourth embodiment, since it is not necessary to drive the voltage of the plate line CP during operation, speed-up of the ferroelectric memory device can be achieved.

Furthermore, in the construction of the fourth embodiment, since it is not necessary to drive the voltage of the plate line CP and therefore the voltage of the plate line voltage supply line CPS is fixed, consequently it is not necessary to drive the plate line voltage supply line CPS, whereby the circuit scale of the plate line voltage supply circuit can be reduced, and furthermore, power consumption of the plate line voltage supply circuit can be reduced, and thus reduction in the area of the plate line voltage supply circuit CPD can be achieved.

Furthermore, in this fourth embodiment, since the plate lines CP also serve as the upper electrodes of the capacitors of the memory cells, the plate lines can be formed without newly providing a wiring layer, and therefore, the semiconductor memory device can be easily fabricated with no increase in process steps.

Furthermore, while in this fourth embodiment the plate line voltage supply line CPS is formed of the same layer as the diffused layer, it may be formed of the same layer as the word line WL. Also in this case, the semiconductor memory device can be easily fabricated because no increase in process steps is required. Further, the plate line voltage supply line CPS may be formed of a layer that is different from the diffused layer OD and the word line WL. In this case, it is desired that the plate line voltage supply line CPS should be formed and arranged so that the resistance thereof is reduced as compared with the case where it is formed of the same layer as the diffused layer OD or the word line WL.

In FIG. 12(a), the number of the plate line voltage supply lines CPS arranged in the column direction is equal to the number obtained by subtracting 1 from the number of the word lines WL, the number of the plate line voltage supply lines CPS may be smaller or larger than that described above so long as the voltage of the plate line does not cause temporal and local undershoot or overshoot which leads to degradation in data holding of a non-operating cell that is disposed in the vicinity of an operating cell. In this case, it is desired to dispose the plate line voltage supply lines CPS so as to reduce the area of the memory cell array MA.

Furthermore, while voltage is supplied to the plate line CP from plural positions in the plate line voltage supply line CPS in the column direction, the number of the voltage supply positions may be smaller or larger than mentioned above so long as the power supply positions do not cause temporal and local undershoot or overshoot of the voltage to the plate line, which leads to degradation in data holding of nonoperating memory cells that are disposed in the vicinity of operating memory cells. In this case, it is desired that the voltage supply positions should be arranged and constituted so as to reduce the area of the memory cell array MA.

Furthermore, while the capacitor of the memory cell is a ferroelectric capacitor using a ferroelectric film as an insulating film for the capacitor, the capacitor of the memory cell may be a high dielectric capacitor using a high dielectric film as an insulating film for the capacitor.

APPLICABILITY IN INDUSTRY

As described above, the present invention provides a semiconductor memory device equipped with a ferroelectric layer, which realizes high-speed operation, reduced area, and low power consumption, and particularly, it is effective to a layout technique or the like of a semiconductor memory device equipped with a ferroelectric layer.

What is claimed is:
1. A semiconductor memory device comprising:
plural memory cells which are formed on a substrate and arranged in a matrix pattern, each memory cell having a capacitor;
plural bit lines, each bit line being commonly connected to the plural memory cells that are arranged in the same row;

plural word lines and plural plate lines, each word line and each plate line being commonly connected to the plural memory cells that are arranged in the same column;

plural plate voltage supply lines arranged in the column direction; and means for electrically connecting each of the plural plate voltage supply lines to each of the corresponding plural plate lines;

wherein the plate voltage supply lines are composed of a material having a resistance lower than that of the plate lines;

each of the plural capacitors is covered with a hydrogen barrier film at its periphery;

the plural plate voltage supply lines are disposed beneath the hydrogen barrier film; and the plural plate voltage supply lines are, when viewed in a plane, electrically connected to the same plate line at plural positions of the same plate line, within a region where the hydrogen barrier film is disposed.

2. A semiconductor memory device as defined in claim 1 wherein each of the plural plate lines also serves as an upper electrode of the capacitor that is included in each of the plural memory cells arranged in the same column.

3. A semiconductor memory device as defined in claim 1 wherein the plural plate voltage supply lines are composed of a diffused layer that is formed in the substrate.

4. A semiconductor memory device as defined in claim 1 wherein the plural plate voltage supply lines are formed of the same layer as the word lines.

5. A semiconductor memory device as defined in claim 1 wherein the plural memory cells covered with the single hydrogen barrier film are divided into at least two memory cell groups in the column direction, and the memory cells that are arranged in the same column and are included in different memory cell groups are connected to different plate lines.

6. A semiconductor memory device as defined in claim 1 wherein the plate lines are selectively operated by the means that electrically connects the plate lines and the plate voltage supply lines.

7. A semiconductor memory device as defined in claim 6 wherein the means that electrically connects the plate lines and the plate voltage supply lines is a selection circuit including at least one transistor.

8. A semiconductor memory device as defined in claim 7 wherein a gate of at least one transistor among the transistors included in the selection circuit is connected to the word lines.

9. A semiconductor memory device as defined in claim 1 wherein the means that electrically connects the plate lines and the plate voltage supply lines is constituted by using at least one of a wiring and a contact plug, and the plate line and the plate voltage supply lines are directly electrically connected.

10. A semiconductor memory device as defined in claim 1 wherein the plate voltage supply lines are power supply lines.

11. A semiconductor memory device as defined in claim 1 wherein the capacitor is a ferroelectric capacitor or a high dielectric capacitor.

12. A semiconductor memory device comprising:

plural memory cells which are formed on a substrate and arranged in a matrix pattern, each memory cell having a capacitor;

plural bit lines, each bit line being commonly connected to the plural memory cells that are arranged in the same row;

plural word lines, each word line being commonly connected to the plural memory cells that are arranged in the same column;

a plate line provided commonly to the plural word lines;

plural plate voltage supply lines arranged in the column direction; and means for electrically connecting the plural plate voltage supply lines to the plate line;

wherein the plate voltage supply lines are composed of a material having a resistance lower than that of the plate line;

each of the plural capacitors is covered with a hydrogen barrier film at its periphery;

the plural plate voltage supply lines are disposed beneath the hydrogen barrier film; and the plural plate voltage supply lines are, when viewed in a plane, electrically connected to the same plate line at plural positions of the same plate line, within a region where the hydrogen barrier film is disposed.

* * * * *